(12) United States Patent
Sakurai

(10) Patent No.: US 9,276,021 B2
(45) Date of Patent: Mar. 1, 2016

(54) ELECTRONIC DEVICE INCLUDING CURRENT SOURCES AND AMPLIFIERS

(71) Applicant: CANON KABUSHIKI KAISHA, Tokyo (JP)

(72) Inventor: Katsuhito Sakurai, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 347 days.

(21) Appl. No.: 13/711,467

(22) Filed: Dec. 11, 2012

(65) Prior Publication Data

US 2013/0153752 A1 Jun. 20, 2013

(30) Foreign Application Priority Data

Dec. 15, 2011 (JP) ................................. 2011-274892

(51) Int. Cl.
| | | |
|---|---|---|
| H01L 27/00 | (2006.01) | |
| H01L 27/144 | (2006.01) | |
| H02J 4/00 | (2006.01) | |
| H04N 5/357 | (2011.01) | |
| H04N 5/365 | (2011.01) | |
| H04N 5/374 | (2011.01) | |
| H04N 5/378 | (2011.01) | |
| H01L 27/146 | (2006.01) | |

(52) U.S. Cl.
CPC ................. *H01L 27/144* (2013.01); *H02J 4/00* (2013.01); *H04N 5/3575* (2013.01); *H04N 5/3658* (2013.01); *H04N 5/378* (2013.01); *H04N 5/3742* (2013.01); *H01L 27/1464* (2013.01); *H01L 27/14605* (2013.01); *H01L 27/14612* (2013.01); *Y10T 307/707* (2015.04)

(58) Field of Classification Search
CPC .............. H01L 27/144; H01L 27/1464; H01L 27/14612; H04N 5/3575; H04N 5/378; H04N 5/3658; H04N 5/3742; H02J 4/00
See application file for complete search history.

(56) References Cited

U.S. PATENT DOCUMENTS

| | | | |
|---|---|---|---|
| 6,184,752 B1 | 2/2001 | Dautriche | |
| 6,339,215 B1 | 1/2002 | Yonemoto | |
| 6,518,910 B2 | 2/2003 | Sakuragi | |
| 7,068,312 B2 | 6/2006 | Kakumoto | |
| 7,091,978 B2 | 8/2006 | Yoshimura | |

(Continued)

FOREIGN PATENT DOCUMENTS

| | | |
|---|---|---|
| JP | 2001-069404 A | 3/2001 |
| JP | 2001-157114 A | 6/2001 |

(Continued)

OTHER PUBLICATIONS

U.S. Appl. No. 13/711,414, filed Dec. 11, 2012, Katsuhito Sakurai.

*Primary Examiner* — Georgia Y Epps
*Assistant Examiner* — Kevin Wyatt
(74) *Attorney, Agent, or Firm* — Canon USA, Inc. IP Division

(57) ABSTRACT

An electronic device according to one or more embodiments of the invention comprises a plurality of first output lines and a plurality of current to voltage convertors. Current signals from a plurality of signal sources are output to the first output lines. Each of the current to voltage convertors are electrically connected to a corresponding one of the first output lines. The current to voltage convertor includes a first amplification unit. An offset reduction unit in a subsequent stage of the current to voltage convertor is provided for each of the first output lines.

19 Claims, 12 Drawing Sheets

(56) References Cited

U.S. PATENT DOCUMENTS

| | | |
|---|---|---|
| 7,542,086 B2 | 6/2009 | Hagihara |
| 7,636,116 B2 | 12/2009 | Hashimoto |
| 2001/0012070 A1* | 8/2001 | Enod .................... H04N 5/32 348/302 |
| 2001/0020909 A1 | 9/2001 | Sakuragi et al. |
| 2005/0259099 A1* | 11/2005 | Jo et al. .................... 345/211 |
| 2007/0008015 A1 | 1/2007 | Hershbarger |
| 2007/0205814 A1 | 9/2007 | Chatal et al. |
| 2007/0236590 A1* | 10/2007 | Harris .................... 348/308 |
| 2009/0027372 A1 | 1/2009 | Shishido et al. |
| 2009/0072120 A1* | 3/2009 | McGarry et al. ........... 250/208.1 |
| 2009/0231478 A1* | 9/2009 | Shinohara ............. H04N 5/217 348/300 |
| 2010/0291870 A1 | 11/2010 | Butler |
| 2010/0321072 A1 | 12/2010 | Bauwelinck et al. |
| 2011/0141324 A1 | 6/2011 | Kosei |
| 2012/0133539 A1 | 5/2012 | Hales |
| 2014/0367550 A1* | 12/2014 | Aisu .................... H01L 27/144 250/206 |

FOREIGN PATENT DOCUMENTS

| | | |
|---|---|---|
| JP | 2001-223566 A | 8/2001 |
| JP | 2003-259228 A | 9/2003 |
| JP | 2004-023135 A | 1/2004 |
| JP | 2008-060872 A | 3/2008 |
| JP | 2008-141609 A | 6/2008 |

* cited by examiner

ELECTRONIC DEVICE INCLUDING CURRENT SOURCES AND AMPLIFIERS

BACKGROUND OF THE INVENTION

1. Field of the Invention

The disclosure relates to an electronic device.

2. Description of the Related Art

Japanese Patent Laid-Open No. 2001-285718 describes a solid-state image pickup device including a plurality of pixels, each of which outputs a current signal.

SUMMARY OF THE INVENTION

An electronic device according to one or more embodiments of the invention comprises a plurality of first output lines and a plurality of current to voltage convertors. Current signals from a plurality of signal sources are output to the first output lines. Each of the current to voltage convertors are electrically connected to a corresponding one of the first output lines. The current to voltage convertor includes a first amplification unit. An offset reduction unit in a subsequent stage of the current to voltage convertor is provided for each of the first output lines.

An electronic device according to one or more embodiments of the invention comprises a plurality of first output lines and a plurality of current to voltage convertors. Current signals from a plurality of signal sources are output to the first output lines. Each of the current to voltage convertors is electrically connected to a corresponding one of the first output lines. The current to voltage convertor includes an first amplification unit. A first storing unit and a second storing unit electrically connected to an output node of the current to voltage converter are provided for each of the first output lines.

Further features of the present invention will become apparent from the following description of exemplary embodiments with reference to the attached drawings.

DESCRIPTION OF THE EMBODIMENTS

Figure 1:
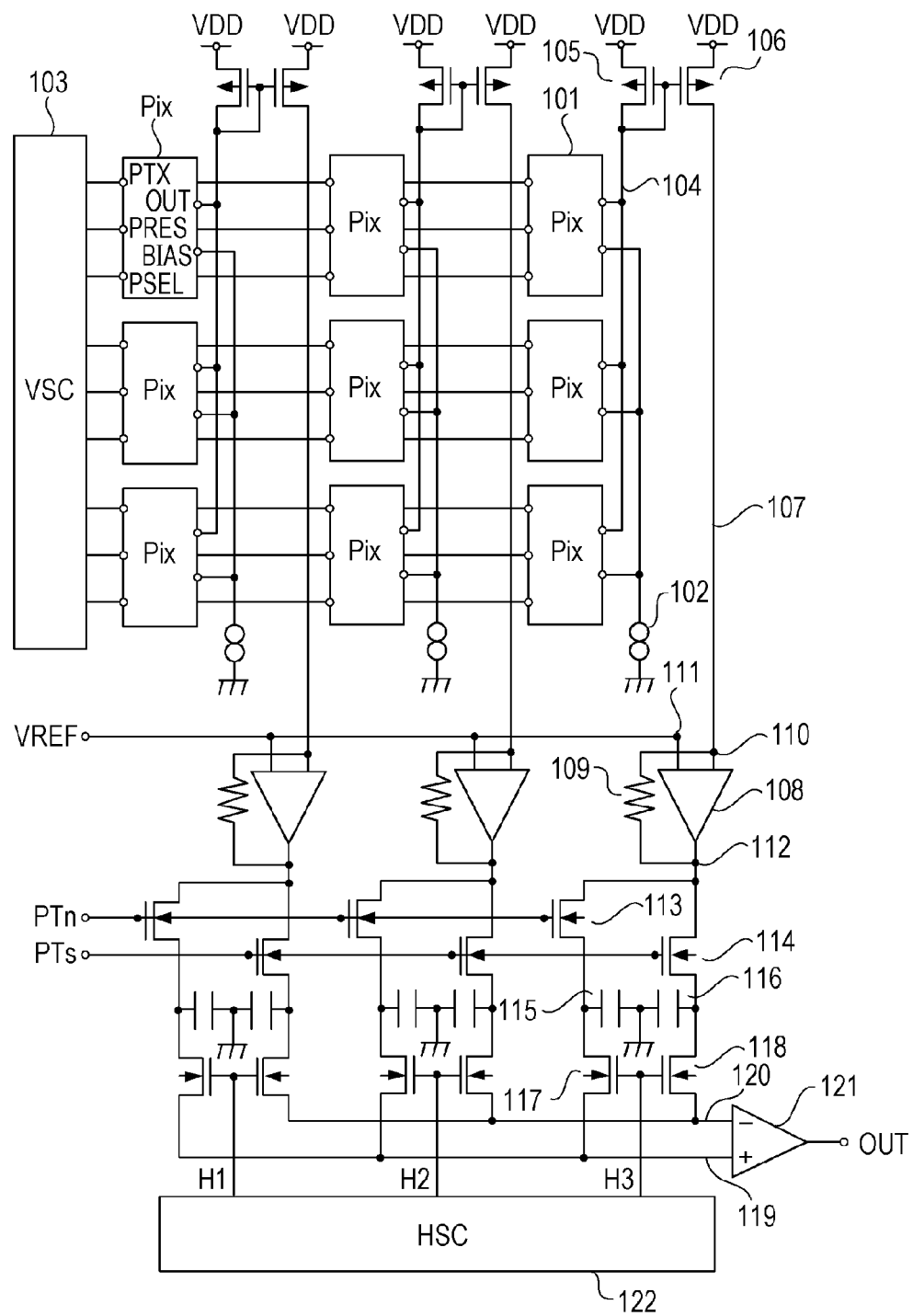
FIG. 1 illustrates an equivalent circuit of a first exemplary embodiment.

An electronic device according to one or more embodiments of the invention may be included in a photoelectric conversion device. The embodiment of the electronic device comprises a plurality of output lines and a current to voltage convertor provided for each of the output lines. The current to voltage convertor converts a current signal to a voltage signal. The current to voltage convertor includes an amplification unit, such as an operational amplifier. The embodiment of the electronic device comprises an offset reduction unit in a subsequent stage of the current to voltage convertor. The offset reduction unit is provided for each of the output lines.

In one or more embodiments, an output node of the current to voltage convertor is electrically connected to at least two storing units. In other embodiments, a clamp capacitor is provided in a subsequent stage of the current to voltage convertor.

A plurality of current signals from a pixel are converted into voltage signals by a single current to voltage convertor. By processing the voltage signals, converted from the current signals, a fluctuation of the characteristics of every current to voltage convertor may be canceled. Hence, in one or more embodiments, an offset caused by the fluctuation of the characteristics of every current to voltage convertor may be reduced.

In one or more embodiments of the present invention, since the current to voltage convertor includes the amplification unit, an offset caused by a fluctuation of the characteristics of the subsequent circuit. For example, in case where the storing unit includes a capacitor, the capacitor may contain a fluctuation in its capacitance. The amplification unit may output an accurate voltage signal regardless of the fluctuation of the capacitor.

In one or more embodiments, current signals are output from the same signal source. In other embodiments, current signals are output from different signal sources. In an embodiment of a photoelectric conversion device, the current signals from the same signal source may be a reset signal and a light signal. The current signals from different signal sources may be a signal from an effective pixel and a signal from an optical black pixel.

A signal source may output a current signal. A memory, a node via which a current signal is input from outside and a sensor are enumerated as exemplary signal sources. The pixel is a sensor for detecting light and may be the signal source. The pixel includes a photoelectric conversion unit and outputs a current signal corresponding to the amount of charges generated by the photoelectric conversion unit. Further, a heat sensor, a pressure sensor and an electromagnetic sensor are enumerated as exemplary sensors.

In a solid-state image pickup device known to the inventor, a plurality of pixels are electrically connected to a signal line. Each pixel outputs a noise signal and a image signal into the signal line. Two capacitors are connected to the signal line. The noise signal may charge up one of the two capacitors, and the picture signal the other. The voltage signals stored in the two capacitors are input to a differential amplifier, whereby the noise may be removed.

The inventor has noted that, in the solid-state image pickup device known to the inventor, an offset among output signals from different pixel columns may occur. A fluctuation among capacitors may cause the offset among the output signals. When current signals which have the same amplitude charge up two capacitors which have different capacitances, the voltages stored in the two capacitors may be different from each other. Due to randomness of the fluctuation, the difference between the voltages stored in the capacitors may differ from every pixel column. Accordingly, the offset among output signals from different pixel columns may occur.

In another case, a first time during which the noise signal is charging up a capacitor and a second time during which the image signal is charging up a capacitor may be different from each other, whereby the voltages stored in the two capacitors may be different from each other.

The inventor has further noted that, in case the electronic device of the embodiment is included in a photoelectric conversion device, the reduction of the offset is beneficial. In this case, the signal source may be the pixel. The photoelectric conversion device may be used in cameras, which generally uses a large number of pixels for obtaining an improved image quality. For example, the photoelectric conversion device may include millions of pixels or more. Further, in the photoelectric conversion device, the pixels may be arranged so as to form a matrix, or a line. Signals from the pixels are read out in parallel on a pixel row basis for high frame rates. Accordingly, a signal processing unit is provided for every pixel column and may cause an offset among output signals from different pixel columns. The offset among output signals from different pixel columns may cause stripe noise in obtained images, which is easily recognized by users as an artifact. Therefore, the reduction of the offset is especially beneficial in the photoelectric conversion device.

In the following detailed description, for purposes of explanation, numerous specific details are set forth in order to provide a thorough understanding of the disclosed embodiments. These embodiments may have the above mentioned features. It will be apparent, however, that one or more embodiments may be practiced without these specific details. In other instances, well-known structures and devices are schematically shown in order to simplify the drawing.

In the following embodiments, an electron is used as a signal charge. In other embodiments, a hole may be used as a signal charge, and the conductivity type of the elements may be inverted.

First Exemplary Embodiment

FIG. 1 illustrates an equivalent circuit of a photoelectric conversion device according to one or more embodiments of the invention. The photoelectric conversion device of the present embodiment includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion outputs the voltage signal to the outside of the device.

In the present embodiment, the current to voltage convertor includes an amplification unit. The output node of the current to voltage convertor is electrically connected to at least two storing units.

Each part of the photoelectric conversion device of the present embodiment will be described in detail. The plurality of pixels 101 are arranged so as to form a pixel array including three rows and three columns. The number of the pixels 101 is not limited. For example, the plurality of pixels 101 are arranged so as to form a pixel array including more than 1000 rows and more than 1500 columns. In another case, the plurality of pixels 101 may be arranged in a line so as to form a line sensor.

Signals from the pixels 101 included in a single pixel column may be processed in common circuitry. In the following description, exemplary one of the pixel columns will be explained. The other pixel columns may have the same structure, configuration and/or circuitry as the exemplary one.

The pixel 101 includes at least a photoelectric conversion unit and a pixel amplification unit. Incident light may be converted into a charge by the photoelectric conversion unit. The pixel amplification unit may output a current signal corresponding to the amount of charges generated by the photoelectric conversion unit. Thus, the pixel 101 may be a signal source configured to output a current signal. The pixel 101 includes OUT node, via which the current signal from the pixel 101 is output. The pixel 101 may further include a BIAS node, via which a bias current is provided from a bias current source, and a plurality of nodes (PTX node, PRES node and PSEL node), via which drive signals are provided. The detailed structure of the pixel 101 will be described later.

The BIAS node of the pixel 101 is electrically connected to the bias current source 102. A plurality of the pixel 101 may be electrically connected to the common bias current source 102. For example, the pixels 101 included in a single pixel column are electrically connected to the common bias current source 102. In another case, a bias current source 102 may be provided for each of the pixels 101 in the pixel column.

The PTX node, the PRES node and the PSEL node are electrically connected to the vertical scanning circuit 103. The vertical scanning circuit 103 may provide a common drive signal for the pixels 101 included in a single pixel row. Further, the vertical scanning circuit 103 may provide the pixels included in different rows from each other with independent drive signals. According to the drive signals the vertical scanning circuit provides, the signals are read out from the pixels 101 on the pixel row basis.

The OUT node of the pixel 101 is electrically connected to a first output line 104. The OUT nodes of a plurality of the pixels 101 may be electrically connected to the common first output line 104. For example, the OUT nodes of the pixels 101 included in a single pixel column are electrically connected to the common first output line 104. Thus, the current signals from the plurality of the pixels 101 may be output to the first output line 104.

The first output line 104 is electrically connected to the current mirror circuit. An output node of the current mirror circuit is electrically connected to a second output line 107. The current mirror circuit includes an input-side transistor 105 and an output-side transistor 106. The input-side and output-side transistors 105, 106 are P-type channel MOS (Metal Oxide Semiconductor) transistors. The gate and the drain of the input-side transistor 105 are shorted. The source of the input-side transistor 105 is electrically connected to a power source line. The power source line may provide the source of the input-side transistor 105 with a power source voltage VDD. The gate of the output-side transistor 106 is electrically connected to the gate of the input-side transistor 105. The source of the output-side transistor 106 is electrically connected to a power source line. The power source line may provide the source of the output-side transistor 106 with a power source voltage VDD. The first output line 104 is electrically connected to the drain of the input-side transistor 105 and the gates which are shorted to the drain of the input-side transistor 105. The drain of the output-side transistor 106 is electrically connected to the second output line 107.

In the current mirror circuit, a current running through the input-side transistor 105 may be mirrored in the output-side transistor 106. In other words, the current mirror circuit may output a current signal (a mirrored current signal) corresponding to the current signal at the first output line 104 into the second output line 107. The current mirror circuit may output the mirror current signal which is amplified or attenuated with respected to the current signal at the first output line 104. The amplification (or attenuation) factor may be determined according to a ratio of the sizes of the input and output-side transistors 105, 106. For example, in a case of the input and output-side transistors 105, 106 having the substantially same channel length, the amplification (or attenuation) factor may be the ratio of the channel widths.

The second output line 107 is electrically connected to the current to voltage convertor. The current to voltage convertor includes an operational amplifier 108 and a conversion resistor 109. The second output line 107 is electrically connected a first input node 110 of the operational amplifier 108. The second input node 111 of the operational amplifier 108 is electrically connected to a reference voltage line. The reference voltage line may provide a reference voltage VREF for the second input node 111 of the operational amplifier. The first input node 110, which is electrically connected to the second output line 107, is electrically connected to an output node 112 of the operational amplifier 108 via the conversion resistor 109. One node of the conversion resistor 109 is connected to the second output line 107 and the first input node 110 of the operational amplifier 108. And, the other node of the conversion resistor 109 is connected to the output node 112 of the operational amplifier.

The operational amplifier may work such that its two input nodes 110 and 111 have the same voltage. Since the reference voltage VREF is provided for the second input node 111, the voltage of the first input node 110 may be set in the reference voltage VREF. That is, the voltage of the one node of the conversion resistor 109 may be the reference voltage VREF. Accordingly, the voltage of the other node of the conversion resistor 109 may be determined by a voltage drop at the conversion resistor 109, which is given by its resistance and amplitude of a current running through the conversion resistor 109. Since the operational amplifier has a high input impedance, all or most of the current at the second output line 107 may flow into the conversion resistor 109. Hence, a voltage corresponding to the amplitude of the current at the second output line 107 may emerge at the output node 112 of the operational amplifier 108. As described above, the current signal from the second output line 107 may be converted into the voltage signal by the current to voltage convertor.

The conversion resistor 109 may have variable resistance. When the resistance of the conversion resistor 109 varies, a conversion gain in the conversion from the current signal to the voltage signal may vary. High resistance may result in a high gain. For a conversion of a current signal with small amplitude, the resistance of the conversion resistor 109 may be high. A high gain may reduce an influence caused by a noise generated in the subsequent stages. For a conversion of a current signal with large amplitude, the resistance of the conversion resistor 109 may be controlled to be low. When a low gain is used, a wide dynamic range may be obtained.

Although the gain at the current to voltage conversion varies, the amplitude of the current running through the conversion resistance may be kept to be substantially constant. Hence, the power consumption may be kept substantially constant. Therefore, the power consumption may be reduced as compared with the case where the amplitude of the current signal is amplified for a high gain.

The output node 112 of the current to voltage convertor is electrically connected to the voltage signal storing portion. The voltage signal storing portion includes a first switch 113, a second switch 114, a CTN capacitor 115 and a CTS capacitor 116. The first switch 113 is provided in an electrical path between the output node 112 of the operational amplifier 108 and one node of the CTN capacitor 115. The gate of the first switch 113 is electrically connected to a PTN node. The other node of the CTN capacitor 115 may be provided with a ground voltage GND. The second switch 114 is provided in an electrical path between the output node 112 of the operational amplifier 108 and one node of the CTS capacitor 116. The gate of the second switch 114 is electrically connected to a PTS node. The other node of the CTS capacitor 116 may be provided with the ground voltage GND.

The PTN node may be provided with a drive signal for controlling the first switch 113 to be turned on or off. The PTS node may be provided with a drive signal for controlling the second switch 114 to be turned on or off. When the first switch 113 turns on, the voltage signal at the output node 112 of the operational amplifier 108 may be stored in the CTN capacitor 115. When the second switch 114 turns on, the voltage signal at the output node 112 of the operational amplifier 108 may be stored in the CTS capacitor 116. As described above, the voltage signal store portion may store the voltage signal, which has been converted from the current signal by the current to voltage convertor.

The voltage signal store portion is electrically connected to the output portion. The output portion includes a third switch 117, a fourth switch 118 and an output amplifier 121. The CTN capacitor 115 is electrically connected to the third output line 119 via the third switch 117. The CTS capacitor 116 is electrically connected to the fourth output line 120 via the fourth switch 118. The gates of the third and fourth switches are electrically connected to the horizontal scanning circuit 122. The third and fourth output lines 119 and 120 are electrically connected to the output amplifier 121. The output node of the output amplifier may be electrically connected to a subsequent signal processing unit (not shown).

The horizontal scanning circuit 122 may provide drive signals for controlling respectively the third and fourth switches 117 and 118 to be turned on or off. When the third switch 117 turns on, the voltage signal stored in the CTN capacitor 115 may be read out into the third output line 119 by capacitive division of charges. When the fourth switch 118 turns on, the voltage signal stored in the CTS capacitor 116 may be read out into the fourth output line 120 by capacitive division of charges. The output amplifier 121 may amplify the voltage signals at the third and fourth output lines 119 and 120 respectively. In another case, the output amplifier 121 may be a differential processing unit. For example, the output amplifier 121 may output a differential signal between the voltage signals at the third and fourth output lines 119 and 120. As above described, the output portion may output the voltage signal stored in the voltage signal storing portion.

Here, the capacitive division of charges will be described in detail. There provided are a first capacitor and a second capacitor which is connectable to the first capacitor via a switch. The capacitor may be a capacitive node. When the first capacitor is connected to the second capacitor, charges in the first capacitor may be divided into the first and second capacitor. In another aspect, the voltage of the first capacitor may be converted into a voltage corresponding to the composite capacitance of the first and second capacitors. For example, the voltage of the CTS capacitor 116 is converted into a voltage corresponding to the composite capacitance of the CTS capacitor 116 and the fourth output line 120.

As described above, the current signal from the pixel, which is a signal source, is converted into the voltage signal, and the converted voltage signal is output to the outside.

Hereinafter, an exemplary structure of the pixel 101 will be described in detail. The pixel 101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 2:
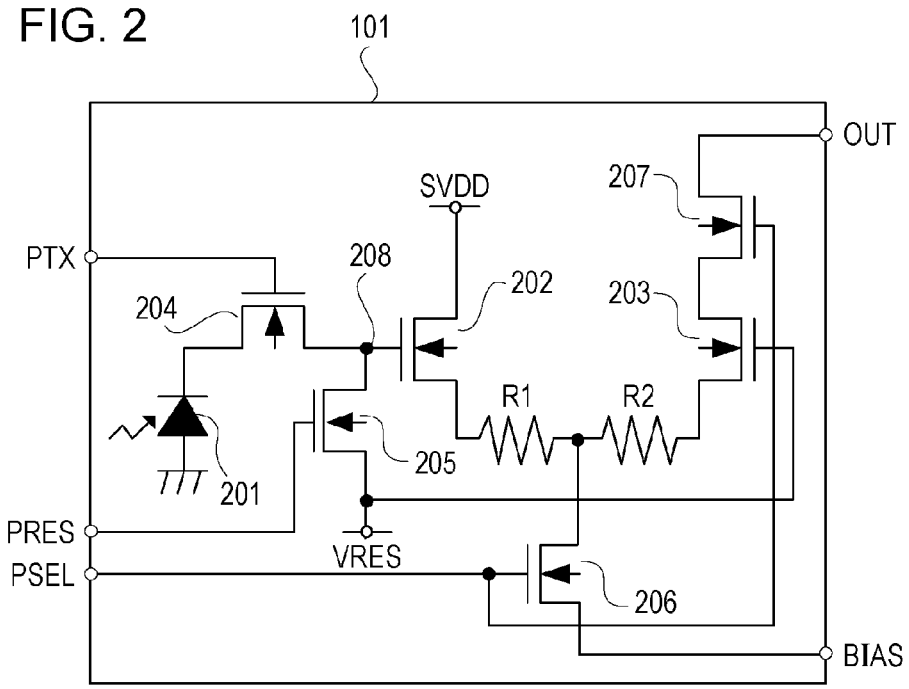
FIG. 2 illustrates an equivalent circuit of an exemplary pixel of an exemplary embodiment.

FIG. 2 illustrates an equivalent circuit of the pixel 101 according to one or more embodiments. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 205, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 transfers the charges generated at the PD 201 to the node 208.

The gate of the first input transistor 202 is electrically connected to the node 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which is provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a reset voltage line. The gate of the second input transistor 203 is a second input node of the differential amplifier. The reset voltage line may provide the gate of the second input transistor 203 with a reset voltage VRES. The source of the second input transistor 203 is electrically connected to the drain of the first selection transistor 206 via the resistor R2. The drain of the second input transistor 203 is electrically connected to the source of the second selection transistor 207.

The node 208 is electrically connected to the reset voltage line via the reset transistor 205. When the reset transistor 205 is turned on, the node 208 is provided with the reset voltage VRES. In other words, the reset transistor 205 may reset the voltage of the first input node of the differential amplifier.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 205 is electrically connected to the PRES node. The gates of the first and second selection transistors 206, 207 are electrically connected to the PSEL node. The vertical scanning circuit 103 provides each gate of the transistors with a drive signal for controlling each of the transistors to be turned on or off.

The first input transistor 202 and the second input transistor 203 may form a differential pair. That is, the sources of the two transistors 202 and 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101, out of the plurality of the pixels 101, which outputs the current signal. In detail, when both of the first and second selection transistors 206, 207 are on, the differential amplifier may output the current signal via the OUT node.

In FIG. 2, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, accuracy of the current signal may be improved because the symmetrical characteristic of the differential amplifier may be improved.

Further, a third selection transistor may be provided in an electrical path between the drain of the first input transistor 202 and the power source line. In case both of the second and third selection transistors are provided, accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that the both transistors 202, 203 are turned off. For example, such voltage may be provided from the reset voltage line. In case both of the first and second selection transistors 206, 207 are omitted, the fill factor of the pixel may be improved by reduction of the number of the pixel transistors.

The transfer transistor 204 may be provided in one or more embodiment. In other embodiments, the transfer transistor 204 may be omitted. In case the transfer transistor 204 is omitted, the fill factor of the pixel may be improved by reduction of the number of the pixel transistors.

Hereinafter, another exemplary structure of the pixel 101 will be described in detail. The pixel 101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 3:
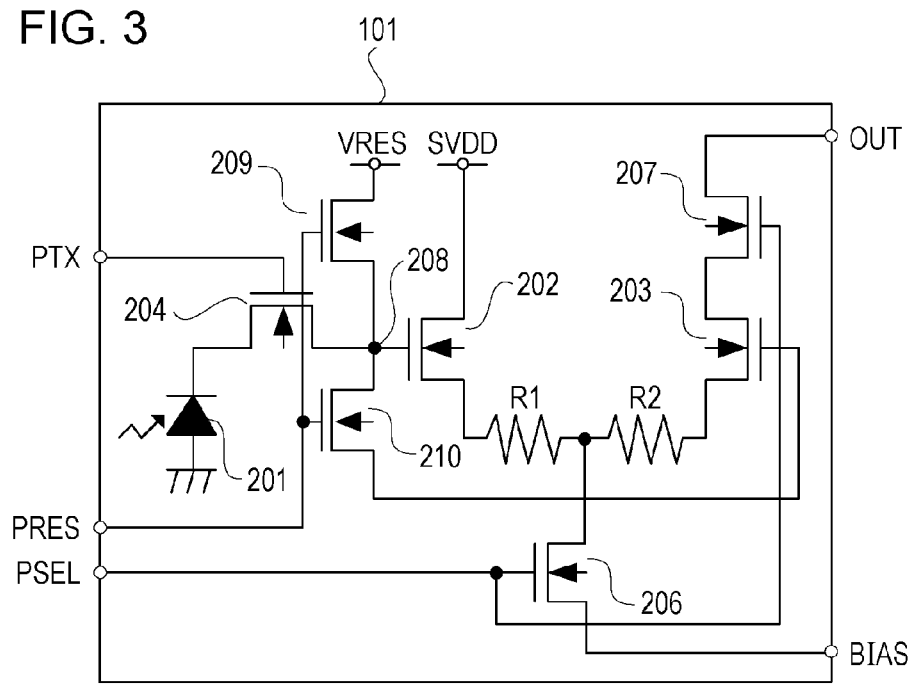
FIG. 3 illustrates an equivalent circuit of an exemplary pixel of an exemplary embodiment.

FIG. 3 illustrates an equivalent circuit of the pixel 101 according to one or more embodiments. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 209, a connection transistor 210, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 transfers the charges generated at the PD 201 to the node 208.

The gate of the first input transistor 202 is electrically connected to the node 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a source of the connection transistor 210. The gate of the second input transistor 203 is a second input node of the differential amplifier. The source of the second input transistor 203 is electrically connected to the drain of the first selection transistor 206 via the resistor R2. The drain of the second input transistor 203 is electrically connected to the source of the second selection transistor 207.

The node 208 is electrically connected to the reset voltage line via the reset transistor 209. When the reset transistor 209 is turned on, the node 208 is provided with the reset voltage VRES. In other words, the reset transistor 209 may reset the voltage of the first input node of the differential amplifier.

The connection transistor 210 is provided in an electrical path between the gate of the first input transistor 202 (the node 208) and the gate of the second input transistor 203. In other words, one of the source and the drain of the connection transistor 210 is electrically connected to the gate of the first input transistor 202 and the other to the gate of the second input transistor 203. When the connection transistor is turned on, the gate of the first input transistor 202 and the gate of the second input transistor 203 are shorted to each other. When both of the reset transistor 209 and the connection transistor 210 are turned on, the reset voltage VRES may be provided for the gate of the second input transistor 203 via the reset transistor 209 and the connection transistor 210.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 209 and the gate of the connection transistor 210 are electrically connected to the PRES node. The gates of the first and second selection transistors 206, 207 are electrically connected to the PSEL node. The vertical scanning circuit 103 provides each gate of the transistors with a drive signal for controlling each of the transistors into on or off.

In FIG. 3, the gate of the reset transistor 209 and the gate of the connection transistor 210 are electrically connected to each other. In another case, the gate of the reset transistor 209 and the gate of the connection transistor 210 may be provided with independent drive signals. In this case the reset transistor 209 and the connection transistor 210 may be controlled independently from each other. For example, when the both of the reset transistor 209 and the connection transistor 210 are on, the reset transistor 209 is firstly turned off, thereafter the connection transistor 210 is turned off.

The first input transistor 202 and the second input transistor 203 may form a differential pair. That is, the sources of the two transistors 202, 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101 which outputs the current signal, out of the plurality of the pixels 101. In detail, when both of the first and second selection transistors 206, 207 are turned on, the differential amplifier may output the current signal via the OUT node.

In FIG. 3, a second reset transistor may be provided in an electrical path between the gate of the second input transistor 203 and the reset voltage line. In this case, accuracy of the current signal may be improved because the symmetrical characteristic of the differential amplifier may be improved.

Figure 4:
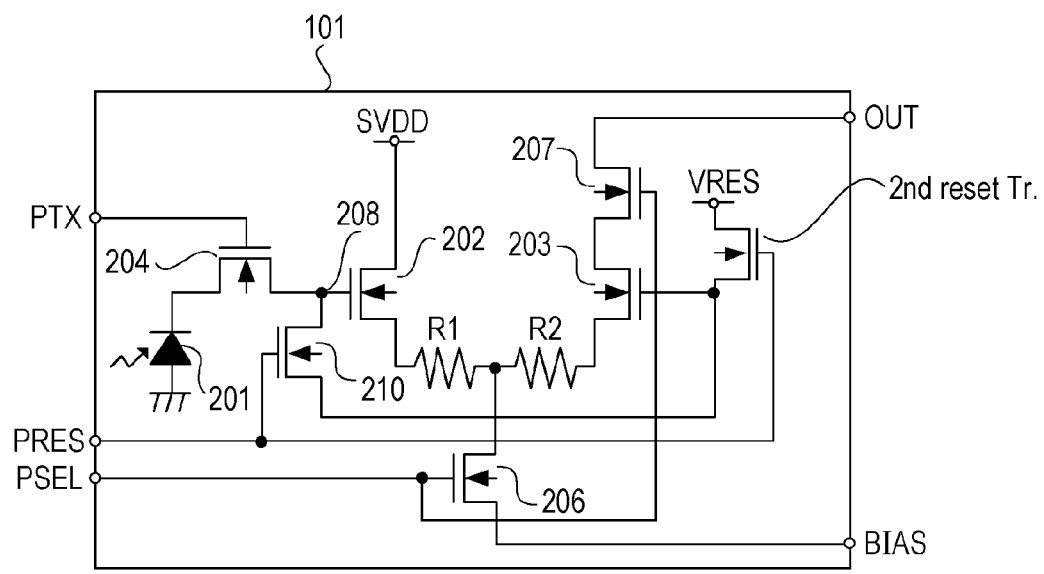
FIG. 4 illustrates an equivalent circuit of an exemplary pixel of an exemplary embodiment.

Other exemplary structure of the pixel 101 will be described in detail. FIG. 4 illustrates an equivalent circuit of the pixel 101 according to one or more embodiments. The reset transistor 209 in FIG. 3 is omitted in FIG. 4. Two transistors (the transfer transistor 204 and the connection transistor 210) are connected to the gate of the first input transistor 202. Two transistors (the second reset transistor and the connection transistor 210) are connected to the gate of the second input transistor 203. Accordingly, since the same number of the transistors is connected to each of the first and second input node of the differential amplifier, accuracy of the current signal may be improved.

In FIGS. 3 and 4, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, accuracy of the current signal may be improved because the symmetrical characteristic of the two input nodes of the differential amplifier may be improved.

Further, a third selection transistor may be provided in an electrical path between the drain of the first input transistor 202 and the power source line. In case both of the second and third selection transistors are provided, accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that the both transistors 202, 203 are turned off. For example, such voltage may be provided from the reset voltage line. In case both of the first and second selection transistors 206, 207 are omitted, the fill factor of the pixel may be improved by reduction of the number of the pixel transistors.

Further, the pixel configuration in FIG. 3 may change such that a charge of the PD 201 may be transferred to the gate of the second input transistor 203. In other words, the transfer transistor may be provided not in an electrical path between the PD 201 and the gate of the first input transistor 202, but in an electrical path between the PD 201 and the gate of the second input transistor 203. In this case, since the same number of the transistors is connected to each of the first and second input node of the differential amplifier, accuracy of the current signal may be improved. Each gate of the first and second input transistors 202, 203 may be set in an electrically floating state after the reset voltage VRES is provided. Accordingly, the current signal corresponding to the difference of the voltages between the two input nodes may be output regardless of which one of the two input node the charge of the PD 201 is transferred to.

In FIGS. 2, 3 and 4, the electron is used as the signal charge, and is transferred to the node 208, which is the gate of the first input transistor 202. The transfer of the electron may lower the voltage of the node 208. The more the charges are transferred, the lower the voltage of the node 208 may become. Since, in the bright situation, a large amount of charges may be transferred to the node 208, the voltage of the node 208 may be low. Since the input transistors 202, 203 have N-type channels, the amplitude of the current signal may be larger in the bright situation than in the dark situation. In another case, the electron of the PD 201 may be transferred to the gate of the second input transistor 203. In this case, the more the charges are transferred, the smaller the amplitude of the current signal may become. The dark situation may include a situation where the voltage of the node 208 has been reset and charges are not transferred to the node 208.

In FIGS. 3 and 4, provided is the connection transistor 210 which connected to the two input nodes of the differential amplifier. Accordingly, the reset noise, which is generated when the input nodes are reset, may be substantially equally divided into the two input nodes. Since the divided noises may cancel each other by the differential amplification, noises in the current signal may be reduced.

As shown in FIG. 1, the circuit for reading out the current signal corresponding to the amount of charges generated in the photoelectric conversion unit into the first output line 104, which is illustrated in each of FIGS. 2, 3 and 4, is repeatedly or periodically arranged. That is, the circuit illustrated in any one of FIGS. 2, 3 and 4 is provided to each of the plurality of the photoelectric conversion units.

In another case, the circuit illustrated in any one of FIGS. 2, 3 and 4 may be provided to every two or more of the plurality of the photoelectric conversion units. In detail, charges of two photoelectric conversion units may be transferred into the gate of the first input transistor 202, which is commonly provided for the two photoelectric conversion units. In this case, a plurality of the photoelectric conversion units may share the transistors other than the transfer transistor. Therefore the fill factor of the pixel may be improved by reduction of the number of the pixel transistors.

In the present embodiment, the transistors which are repeatedly provided so as to correspond to the plurality of the photoelectric conversion units may have the same conductivity type. Specifically, the first and second input transistors 202, 203, the transfer transistor 204, the reset transistor 205, the first and second selection transistors 206, 207, the reset transistor 209 and the connection transistor 210 are respectively N-type channel MOS transistors. In this case, since a single conductivity type of a well may be provided in the pixel 101, the fill factor of the pixel, which is a ratio of a region that the photoelectric conversion unit occupies to a region of a single pixel, may be improved. Therefore, sensitivity and/or a saturation amount of charges may be improved. However, a part of these transistors may have a different conductivity type from the others.

In the present embodiment, the electron may be used as the signal charge, and the N-type channel transistors may be provided. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used.

An element which is provided commonly for a plurality of the photoelectric conversion units, and is not repeatedly arranged may be included in the circuit for reading out the current signal corresponding to the amount of charges generated in the photoelectric conversion unit into the first output line 104. For example, the bias current source 102 in FIG. 1 may be included in the circuit for reading out because it may drive the differential amplifier by providing the bias current. In FIG. 1, the bias current source 102, however, is provided for each of the plurality of the pixel rows. Thus, the bias current source 102 is not an element which is repeatedly arranged so as to correspond to the plurality of the photoelectric conversion units.

Figure 5:
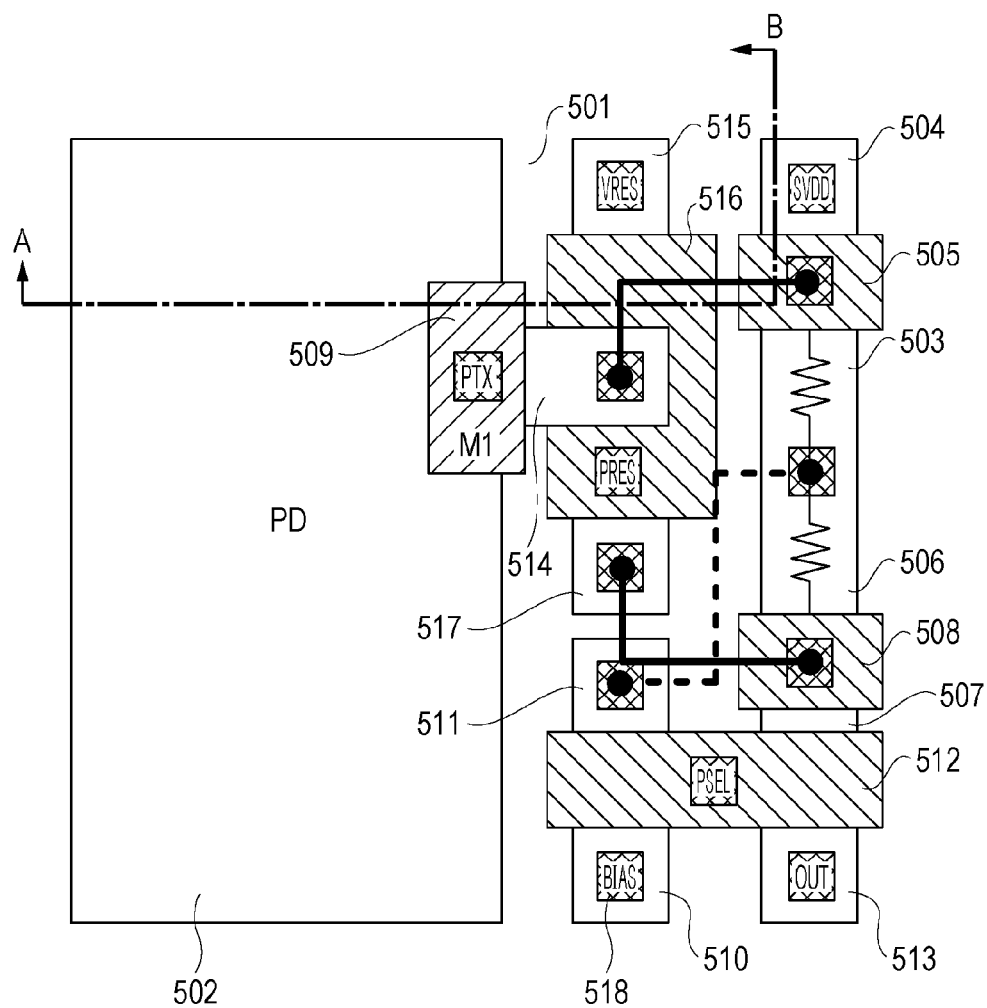
FIG. 5 is a schematic illustration of the planar structure of an exemplary pixel of an exemplary embodiment.

FIG. 5 is a schematic illustration of the planar structure of the pixel illustrated in FIG. 3. The pixel circuit may be provided in a semiconductor substrate, such as a silicon substrate or the like. The semiconductor substrate includes an active region, which is defined by an element isolation portion 501. Elements, such as photodiodes, transistors and resistors, may be provided in the active region.

The element isolation portion 501 may include an isolation structure such as LOCOS (Local Oxidation of Silicon) or STI (Shallow Trench Isolation). In another case, the element isolation portion 501 may include an isolation structure using a PN junction. The element isolation portion 501 may electrically isolate the PD and the transistors.

In the present embodiment, the MOS transistors are used in the pixel. Each transistor has a source region, a drain region, a gate electrode and a channel region. The source region, the drain region and the channel region are semiconductor regions provided in the semiconductor substrate. The gate electrode may be formed of a poly-silicon provided on the semiconductor substrate via an insulator film.

The PD 201 includes a semiconductor region 502. The first input transistor 202 may include semiconductor regions 503, 504 and a gate electrode 505 as the source, the drain and the gate. The second input transistor 203 may include semiconductor regions 506, 507 and a gate electrode 508 as the source, the drain and the gate. The semiconductor regions 503 and 506 may respectively form the resistors R1 and R2. The transfer transistor 204 may include a gate electrode 509 as the gate. The first selection transistor 206 may include semiconductor regions 510, 511 and a gate electrode 512 as the source, the drain and the gate. The second selection transistor 207 may include semiconductor regions 507, 513 and the gate electrode 512 as the source, the drain and the gate. The reset transistor 209 may include semiconductor regions 514, 515 and a gate electrode 516 as the source, the drain and the gate.

The connection transistor 210 may include the semiconductor regions 514, 517 and the gate electrode 516 as the source, the drain and the gate.

Contact plugs 518 are provided for the gate electrode and the semiconductor regions each of which forms the source or the drain. The semiconductor regions and the gate electrode may be connected to conductive members included in interconnections via the contact plugs 518. For example, the semiconductor region 514 and the gate electrode 505 are connected to each other by the interconnection, and form the node 208 in FIG. 3.

As shown in FIG. 5, two nodes, which are supposed to be electrically connected to each other, may be formed of a common semiconductor region or a common gate electrode. For example, since the drain of the second input transistor 203 may be connected to the source of the second selection transistor 207, both nodes are formed of the semiconductor region 507. In another case, however, the two nodes may be formed of two separated semiconductor regions. The gate of the reset transistor 209 and the gate of the connection transistor 210 may be formed of two separated gate electrodes. Although, in FIG. 8, the resistors R1 and R2 are formed of the semiconductor regions 503 and 506, the resistors R1 and R2 may be thin film resistors formed of poly-silicon as the like.

As shown in FIG. 5, the structure from the gate electrode 505 to the gate electrode 508 may have symmetry with respect to a line. In this case, accuracy of the current signal may be improved because the symmetrical characteristic of the differential amplifier may be improved.

Figure 6:
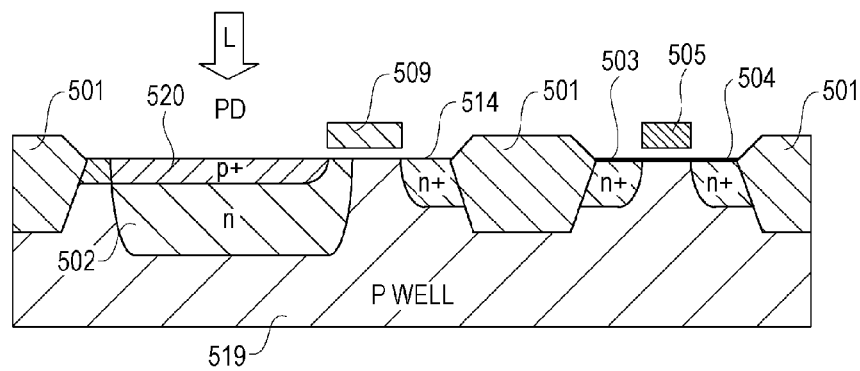
FIG. 6 is a schematic illustration of the cross-sectional structure of an exemplary pixel of an exemplary embodiment.

FIG. 6 is a schematic illustration of an exemplary cross-sectional structure taken along a line A-B in FIG. 5. The PD 201, the transfer transistor 204 and the first input transistor 202 are exemplarily illustrated in FIG. 6. The same reference symbol is used to indicate elements in FIG. 6 and FIG. 5 which perform the same or a similar function, and detailed descriptions of the elements are not repeated.

The PD 201 includes an N-type semiconductor region 502. The N-type semiconductor region 502 may accumulate generated charges therein. The first input transistor 202 may include N-type semiconductor regions 503 and 504 as the source and the drain. Accordingly, the first input transistor 202 may have an N-type channel. These N-type semiconductor regions may be provided in a P-type well 519. The P-type well 519 may be provided with the ground voltage GND.

The P-type well 519 may be a semiconductor region formed by diffusing or implanting impurities into the semiconductor substrate. In another case, the P-type well 519 may be formed by an epitaxial layer grown on the semiconductor substrate.

A P-type semiconductor region 520 is provided adjacent to the N-type semiconductor region 502 of the PD 201. The P-type semiconductor region 520 may be connected to the P-type well 519 and be provided with the ground voltage GND. The P-type semiconductor region 520 may reduce a noise caused by a dark current generated at the interface of the semiconductor substrate and an insulator.

Figure 9:
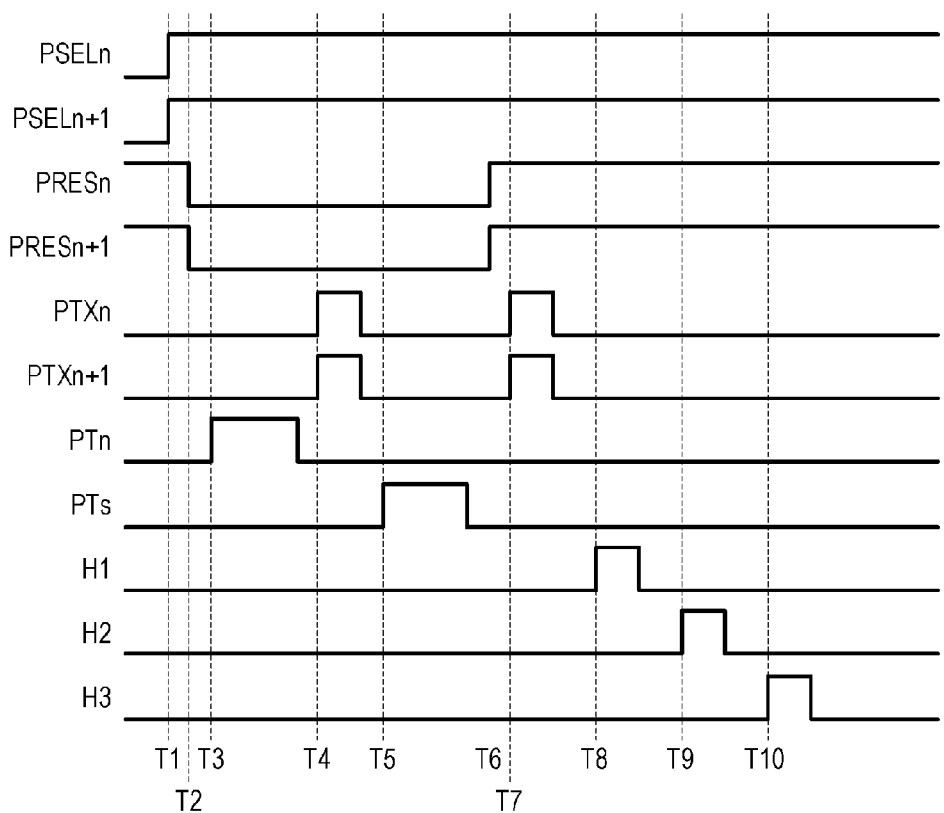
FIG. 9 is a timing chart of an exemplary operation for an exemplary embodiment.

In case the transistors which included in the pixel circuit have the same conductivity type, a single conductivity type of a well may be used in the pixel as shown in FIG. 9. Therefore, the fill factor of the pixel, which is a ratio of a region that the photoelectric conversion unit occupies to a region of a single pixel, may be improved. Therefore, sensitivity and/or a saturation amount of charges may be improved.

In the present embodiment, the PD 201 which accumulates electrons may be formed by providing N-type semiconductor region 502 in the P-type well 519. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used, and vice versa.

If two wells having different conductive type from each other are provided, a PN junction may be formed between the two wells. In this case, the elements are provided with a distance from the PN junction in order to avoid the influence the electrical field caused by the PN junction may impose on.

As shown in FIG. 6, light may enter the semiconductor substrate in a direction indicated by L. That is, the photoelectric conversion device illustrated in FIG. 6 is a front-side illuminated type.

Figure 7:
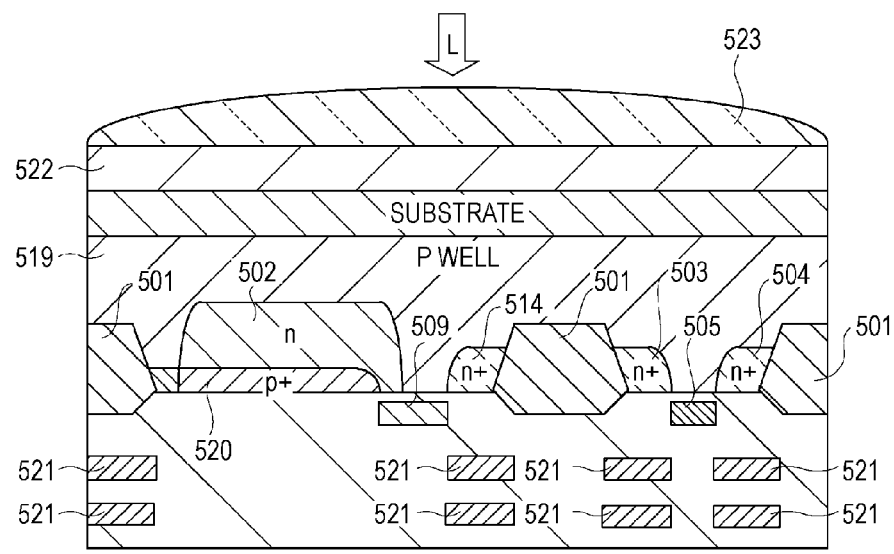
FIG. 7 is a schematic illustration of the cross-sectional structure of an exemplary pixel of an exemplary embodiment.

FIG. 7 is a schematic illustration of another exemplary cross-sectional structure taken along a line A-B in FIG. 5. The PD 201, the transfer transistor 204 and the first input transistor 202 are exemplarily illustrated in FIG. 7.

The photoelectric conversion device illustrated in FIG. 7 is a back-side illuminated type. In detail, light may enter the semiconductor substrate from a side (back side) opposite to a side (front side) on which the gate electrodes of the transistors are provided. L in FIG. 7 indicates a direction in which light may enter the semiconductor substrate.

The same reference symbol is used to indicate elements in FIG. 7 and FIG. 6 which perform the same or a similar function, and detailed descriptions of the elements are not repeated. A conductive member 521 included in an interconnection is shown in FIG. 7. Further, a color filter 522 and a lens 523 may be provided on the back side of the semiconductor substrate.

In the back-side illuminated type photoelectric conversion device, conductive members and gate electrodes, which may shield incident light, may be reduced on a side (back side) though which the incident light may enter the semiconductor substrate. Accordingly, sensitivity may be improved.

The photoelectric conversion device of the present embodiment may include a second semiconductor substrate. The second semiconductor substrate may include transistors in the circuit for reading out the current signal from the pixels or the signal processing circuit. The second semiconductor substrate may be provided on a first side of the conductive member 521, the first side being opposite to a second side of the conductive member 521 on which the PD 201 is provided. In another aspect of view, the (first) semiconductor substrate where the PD 201 is provided and the second semiconductor substrate where the transistors are provided may be arranged so as to face to each other with the conductive member included in the interconnection therebetween. In this case, the fill factor of the pixel may be improved by reduction of the number of the pixel transistors which are provided in the same semiconductor substrate as the PD 201.

Figure 8:
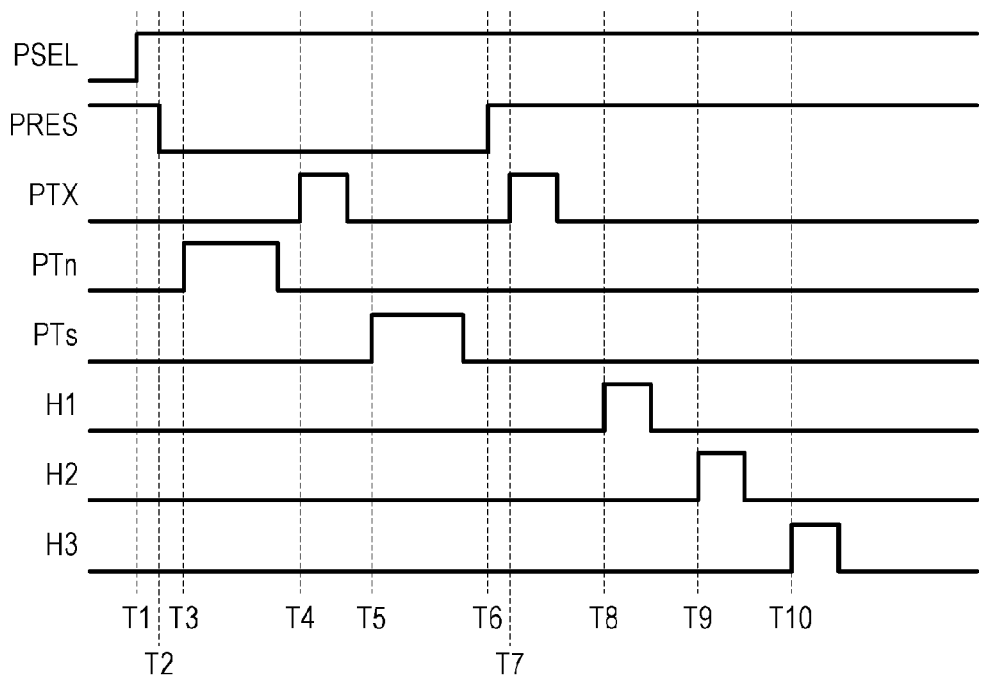
FIG. 8 is a timing chart of an exemplary operation for an exemplary embodiment.

Hereinafter, an exemplary operation for the photoelectric conversion device according to one or more embodiments will be described. FIG. 8 is a timing chart of the drive signals. The drive signals PSEL, PRES, PTX, PTN and PTS, illustrated in FIG. 8, are respectively provided for the PSEL node, the PRES node, the PTX node, the PTN node and the PTS node, illustrated in FIG. 1. The drive signal H1 is provided for the gates of the third and fourth switches 117, 118 of the leftward pixel column in FIG. 1. The drive signal H2 is provided for the gates of the third and fourth switches 117, 118 of the middle pixel column in FIG. 1. The drive signal H3 is provided for the gates of the third and fourth switches 117, 118 of the rightward pixel column in FIG. 1.

Each of the drive signals may have at least two values which correspond to a high level and a low level. In analog circuits, the high level of the drive signal may turn on the corresponding transistor. The low level of the drive signal may turn off the corresponding transistor.

Before T1, the PRES is of a high level. The other drive signals are of low levels. At this time, the reset voltage VRES is provided for the node 208 and the gate of the second input transistor 203. Since the transfer transistor 204 is turned off in this period, charges generated by photoelectric conversion may be accumulated in the PD 201.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 208 may become electrically floating. In the pixel illustrated in FIG. 3, the node 208 and the gate of the second input transistor 203 may become electrically floating.

At T3, the PTN turns into a high level. When the PTN is of a high level, the voltage signal converted from the current signal from the pixel may be stored in the CTN capacitor 115. At T3, the voltage of the input node (node 208) of the pixel amplification unit is the reset voltage VRES. Accordingly, a voltage signal corresponding to a current signal that the pixel outputs when in a state of being reset is stored in the CTN capacitor 115. The current signal that the pixel outputs when in a state of being reset, or the voltage signal converted therefrom, may contain a reset nose, which is generated when the reset transistor turns off. After a period passes since T3, the PTN turns into a low level.

At T4, the PTX turns into a high level, whereby the charge generated at PD 201 may be transferred to the node 208. At this time, the whole charges of the PD 201 may be transferred to the node 208. After a period passes since T4, the PTX turns into a low level.

By the transfer of the charges to the node 208, the voltage of the node 208 may change from the reset voltage VRES. The amount of the voltage change may be defined by the amount of the charges transferred. On the other hand, the voltage of the gate of the second input transistor 203 may be kept at the reset voltage VRES. Thus, the voltage difference according to the amount of the charges may emerge between the two input nodes of the differential amplifier, and the differential amplifier may output the current signal according to the voltage difference.

At T5, the PTS turns into a high level. When the PTS is of a high level, the voltage signal converted from the current signal from the pixel may be stored in the CTS capacitor 116. At T5, the voltage of the input node (node 208) of the pixel amplification unit is a voltage corresponding to the amount of the charges generated by the incident light. Accordingly, a voltage signal corresponding to the amount of the incident light is stored in the CTS capacitor 116. The voltage signal corresponding to the amount of the incident light may contain a reset nose, which is generated when the reset transistor turns off. After a period passes since T5, the PTS turns into a low level.

The PRES turns into a high level at T6 and the PTX turns into a high level at T7, whereby the reset voltage VRES may be provided for the node 208 and the cathode of the PD 201. In other words, the pixel 101 may be reset. In another case, the PRES and the TTX turn into high levels simultaneously. In further another case, the PTX turns into a high level before the PRES turns into a high level. After a period passes since T7, the PTX turns into a low level. After the pixel has been reset, the PSEL turns into a low level. The PSEL may turn into a low level before the signal is output from the pixel to be read out thereafter.

From T8, the signal which is stored in the voltage signal storing portion of each pixel column is serially read out. At T8, the H1 turns into a high level, whereby the voltage signals stored in the CTN capacitor 115 and CTS capacitor 116 of the leftward pixel column in FIG. 1 are read out into the output portion. At T9, the H2 turns into a high level, whereby the voltage signals stored in the CTN capacitor 115 and CTS capacitor 116 of the middle pixel column in FIG. 1 are read out into the output portion. At T10, the H3 turns into a high level, whereby the voltage signals stored in the CTN capacitor 115 and CTS capacitor 116 of the rightward pixel column in FIG. 1 are read out into the output portion.

In one or more embodiments, reading out of signals from the pixels in a different row may start after the all of the voltage signals stored in the voltage signal storing portions are read out. In other embodiments, reading out of signals from the pixels in a different row may start after the voltage signals are stored in the voltage signal storing portions. At T7, for example, reading out for the pixel to be read out sequentially is started.

In other embodiments, the selection transistor may be omitted. In this case, the PSEL is not provided. Alternatively, a voltage for turning off one or both of the first and second input transistors 202, 203 may be provided for the gates thereof during a corresponding period, in which the PSEL is of a low level. Accordingly, the pixel may be set in a non-selected state.

In the pixel corresponding to FIG. 3, a timing of turning off the reset transistor 209 and a timing of turning off the connection transistor 210 may be offset. In detail, the reset transistor 209 turns off before the connection transistor 210 turns off. By this order of the operation, the reset noises, which is generated when the reset transistor 209 turns off, may be substantially equally divided into the two input nodes. As the result, since the divided noises may cancel each other by the differential amplification, noises in the current signal may be reduced.

The read out of the signal that the pixel outputs when in a state of being reset may be omitted. Even though the read out of the signal that the pixel outputs when in a state of being reset is omitted, an offset noise of the pixel and the reset noise may be reduced because the pixel amplification unit is the differential amplifier. However, with the read out of the current signal that the pixel outputs when in a state of being reset, offset noises generated in the subsequent states of the pixel may be reduced.

Hereinafter, another exemplary operation for the photoelectric conversion device according to one or more embodiments will be described. In this operation, the drive signal PSEL may be provided parallel for the pixels in a plurality of the pixel rows. Thus, the pixels in the plurality of the pixel rows may simultaneously output the current signals to the same first output line 104. According to this way of operation, the current signals may be summed up or averaged at the first output line 104. In this case, each of the drive signals PSEL, PRES, PTX may be provided for the pixels in the plurality of the pixel rows simultaneously.

FIG. 9 is a timing chart of the drive signals for the above described addition or average. The drive signals PSELn, PRESn and PTXn are respectively provided for the PSEL node, the PRES node and the PTX node of the pixel included in the pixel row N. The drive signals PSELn+1, PRESn+1 and PTXn+1 are respectively provided for the PSEL node, the PRES node and the PTX node of the pixel included in the pixel row N+1.

As illustrated in FIG. 9, the drive signals for the pixel row N and for the pixel row N+1 are synchronized. Thus, the current signals of the pixels included in a plurality of the pixel rows may be output to the first output line 104 in parallel. The detailed operation in the FIG. 9 is the same as in FIG. 8, and the detailed description is not repeated.

For addition of two current signals from two pixels, the bias current source 102 may output the bias current which has the amplitude twice as large as that of the bias current the bias current source 102 may output when the current signal from a single pixel is individually output. Then each of the differential amplifiers of the two pixels may be provided with the bias current as large as that provided when the current signal from a single pixel is individually output. Accordingly, the current signals to be added to each other, or summed up, may have respectively the same amplitude as output individually. In the case where the current signals from more than two pixels are summed up, the bias current may be turned up in accordance with the number of the signals to be summed up. For the average of the current signals, the bias current may be set in the same amplitude when the current signal from a single pixel is being output.

As described above, the offset among a plurality of the pixel columns may be reduced in the present embodiment.

Second Exemplary Embodiment

Figure 10:
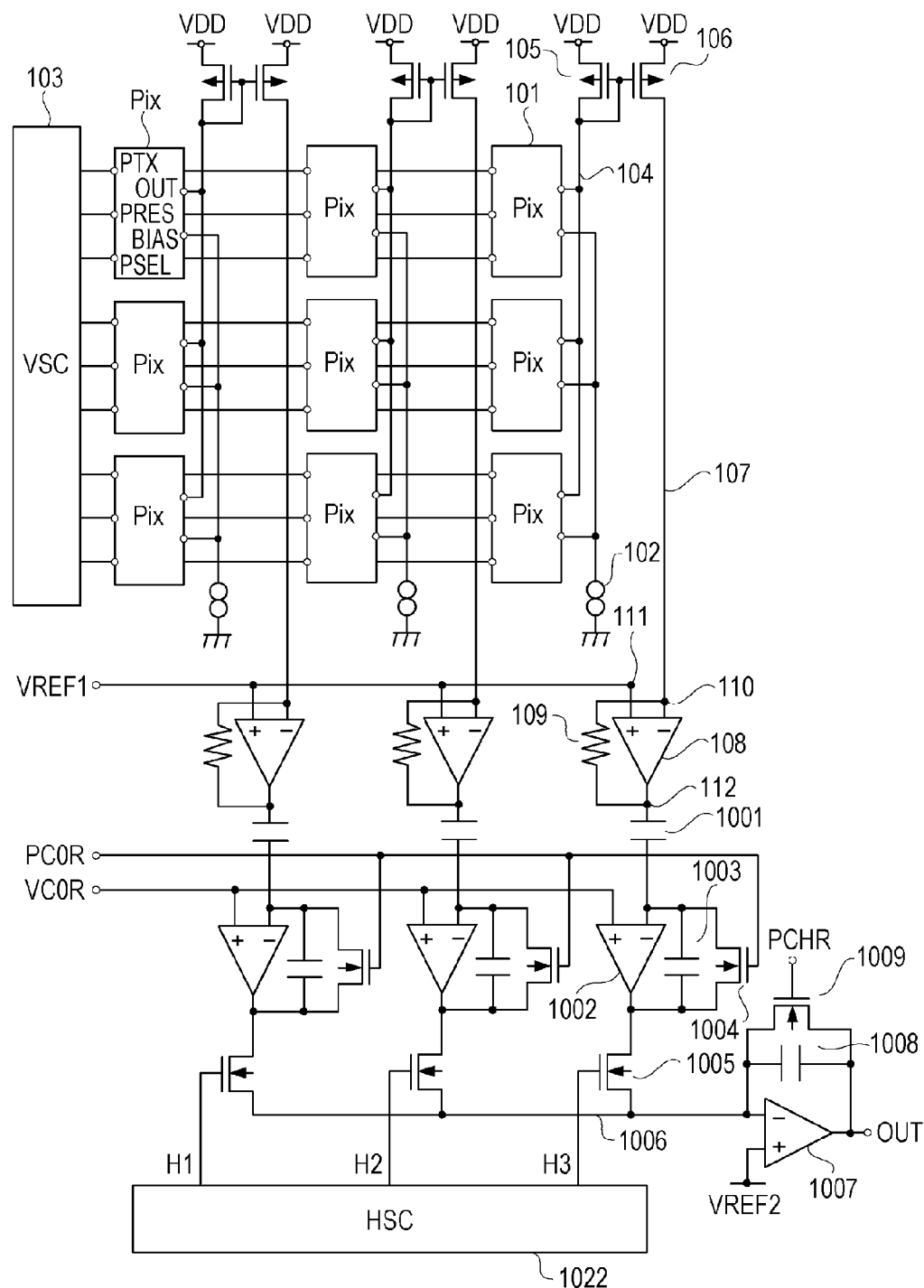
FIG. 10 illustrates an equivalent circuit of a second exemplary embodiment.

FIG. 10 illustrates an equivalent circuit of a photoelectric conversion device according to one or more embodiments. The same reference symbol is used to indicate elements in FIG. 10 and FIG. 1 which perform the same or a similar function, and detailed descriptions of the elements are not repeated. In the present embodiment, a subsequent part after the current to voltage convertor is different from that of the above described embodiment. The other features may be the same as the above described embodiment. The detailed explanation of the same features as the above described embodiment is not repeated.

In the present embodiment, the voltage signal output from the voltage to current convertor is clamped. Accordingly, the offset noise may be reduced in one or more embodiments.

The output node 112 of the current to voltage convertor is electrically connected to one node of a clamp capacitor 1001. The other node of the clamp capacitor 1001 is electrically connected to a first input node of a second operational amplifier 1002. A first feedback capacitor 1003 and a first feedback switch 1004 are arranged in parallel between the first input node and the output node of the second operational amplifier 1002. A second input node of the second operational amplifier 1002 may be provided with a reference clamp voltage VCOR. The gate of the first feedback switch 1004 is provided with a drive signal PCOR. When the drive signal PCOR is of a high level, the first feedback switch 1004 may turn on. When the drive signal PCOR is of a low level, the first feedback switch 1004 may turn off.

The output node of the second operational amplifier 1002 is electrically connected to a horizontal output line 1006 via a horizontal transfer switch 1005. The gate of the horizontal transfer switch 1005 is electrically connected to the horizontal scanning circuit 122. The horizontal scanning circuit 122 may control the horizontal transfer switch 1005.

The horizontal output line 1006 is electrically connected to the output portion. The output portion includes a third operational amplifier 1007, a second feedback capacitor 1008 and a second feedback switch 1009. The horizontal output line 1006 is electrically connected to a first input node of the third operational amplifier 1007. The second feedback capacitor 1008 and the second feedback switch 1009 are arranged in parallel between the first input node and the output node of the third operational amplifier 1007. A second input node of the third operational amplifier 1007 may be provided with a second reference voltage VREF2. The gate of the second feedback switch 1009 is provided with a drive signal PCHR.

In the present embodiment, the second input node 111 of the operational amplifier 108 may be provided with a first reference voltage VREF1. The first reference voltage VREF1 may be the same as the reference voltage VREF in the above described embodiment.

An exemplary structure of the pixel may be the same as the above described embodiment. The equivalent circuit of the pixel is illustrated in FIG. 2, 3 or 4. The exemplary planar and cross-sectional structures of the pixel is illustrated in FIGS. 5, 6 and 7.

Figure 11:
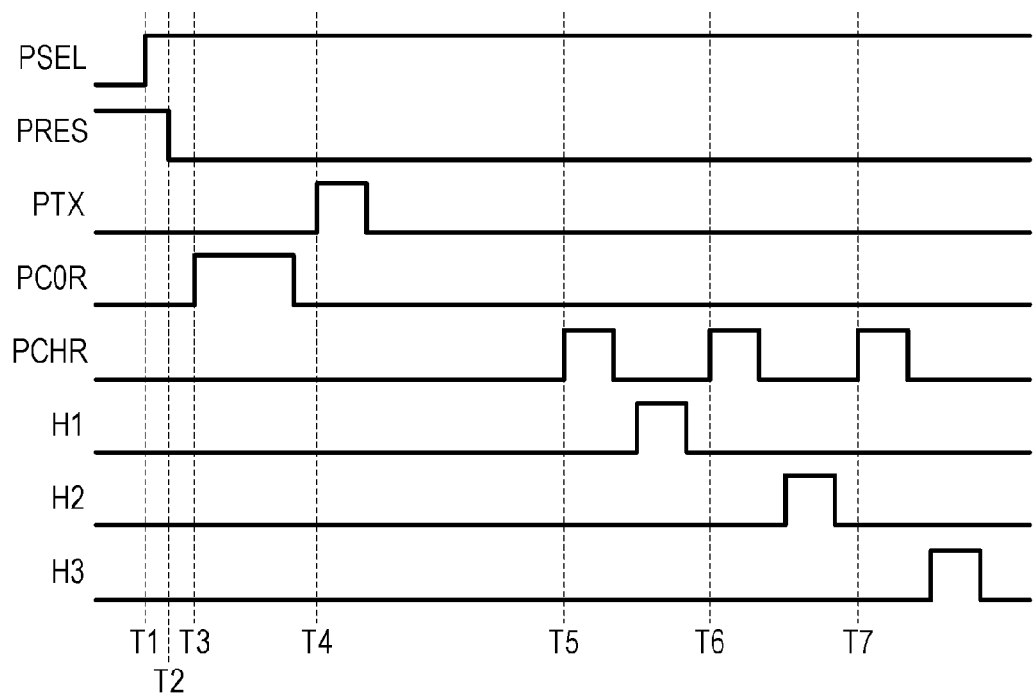
FIG. 11 is a timing chart of an exemplary operation for an exemplary embodiment.

Hereinafter, an exemplary operation for the photoelectric conversion device according to one or more embodiments will be described. FIG. 11 is a timing chart of the drive signals. The drive signals PSEL, PRES and PTX, illustrated in FIG. 11, are respectively provided for the PSEL node, the PRES node and the PTX node, illustrated in FIG. 10. The drive signal H1 is provided for the gate of the horizontal transfer switch 1005 of the leftward pixel column in FIG. 10. The drive signal H2 is provided for the gate of the horizontal transfer switch 1005 of the middle pixel column in FIG. 10. The drive signal H3 is provided for the gate of the horizontal transfer switch 1005 of the rightward pixel column in FIG. 10. The drive signal PCOR is provided for the gate of the first feedback switch 1004. The drive signal PCHR is provided for the gate of the second feedback switch 1009.

Before T1, the PRES is of a high level. The other drive signals are of low levels. At this time, the reset voltage VRES is provided for the node 208 and the gate of the second input transistor 203. Since the transfer transistor 204 is turned off in this period, charges generated by photoelectric conversion may be accumulated in the PD 201.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 208 may become electrically floating. In the pixel illustrated FIG. 3, the node 208 and the gate of the second input transistor 203 may become electrically floating.

At T3, the PCOR turns into a high level. When the PCOR is of a high level, the first feedback switch 1004 is turned on, hence the voltages of the first input node and the output node of the second operational amplifier 1002 are set in the reference clamp voltage VCOR. At T3, the voltage of the input node (node 208) of the pixel amplification unit is the reset voltage VRES. Accordingly, the voltage of the output node 112 of the current to voltage convertor is a voltage signal corresponding to a current signal that the pixel outputs when in a state of being reset. The voltage signal of the output node 112 is clamped by the clamp capacitor 1001. The voltage signal corresponding to a current signal that the pixel outputs when in a state of being reset may contain a reset nose, which is generated when the reset transistor turns off. After a period passes since T3, the PCOR turns into a low level.

At T4, the PTX turns into a high level, whereby the charge generated at PD 201 may be transferred to the node 208. At this time, the whole charges of the PD 201 may be transferred to the node 208. After a period passes since T4, the PTX turns into a low level.

By the transfer of the charges to the node 208, the voltage of the node 208 may change from the reset voltage VRES. The amount of the voltage change may defined by the amount of the charges transferred. On the other hand, the voltage of the gate of the second input transistor 203 may be kept at the reset voltage VRES. Thus, the voltage difference according to the amount of the charges may emerge between the two input nodes of the differential amplifier, and the differential amplifier may output the current signal according to the voltage difference. Then, a voltage signal corresponding to the amount of the charges generated by the incident light may be output via the output node 112 of the current to voltage convertor. Since the first feedback switch 1004 is turned off at this time, the second operational amplifier 1002 may output a differential signal of the voltage signal corresponding to the amount of the incident light and the voltage signal corresponding to a current signal that the pixel outputs when in a state of being reset. The gain of the second operational amplifier 1002 may be determined by a ratio of capacitances of the cramp capacitor 1001 and the first feedback capacitor 1003

At T5, the PCHR turns into a high level, whereby the voltages of both nodes of the second feedback capacitor 1008 are reset to the second reference voltage VREF2. After the PCHR turns into a low level, the H1 turns into a high level, whereby the charges of the first feedback capacitor 1003 may be transferred to the second feedback capacitor 1008. Thus, the differential signal may be output at the output node of the third operational amplifier 1007. At T6 and T7, the signals of other pixel columns are read out, likewise.

As described above, the voltage signal output from the voltage to current convertor is clamped, whereby the differential signal of the voltage signal corresponding to the amount of the incident light and the voltage signal corresponding to a current signal that the pixel outputs when in a state of being reset is obtained. Accordingly, the offset among a plurality of the pixel columns may be reduced in the present embodiment.

Third Exemplary Embodiment

Figure 12:
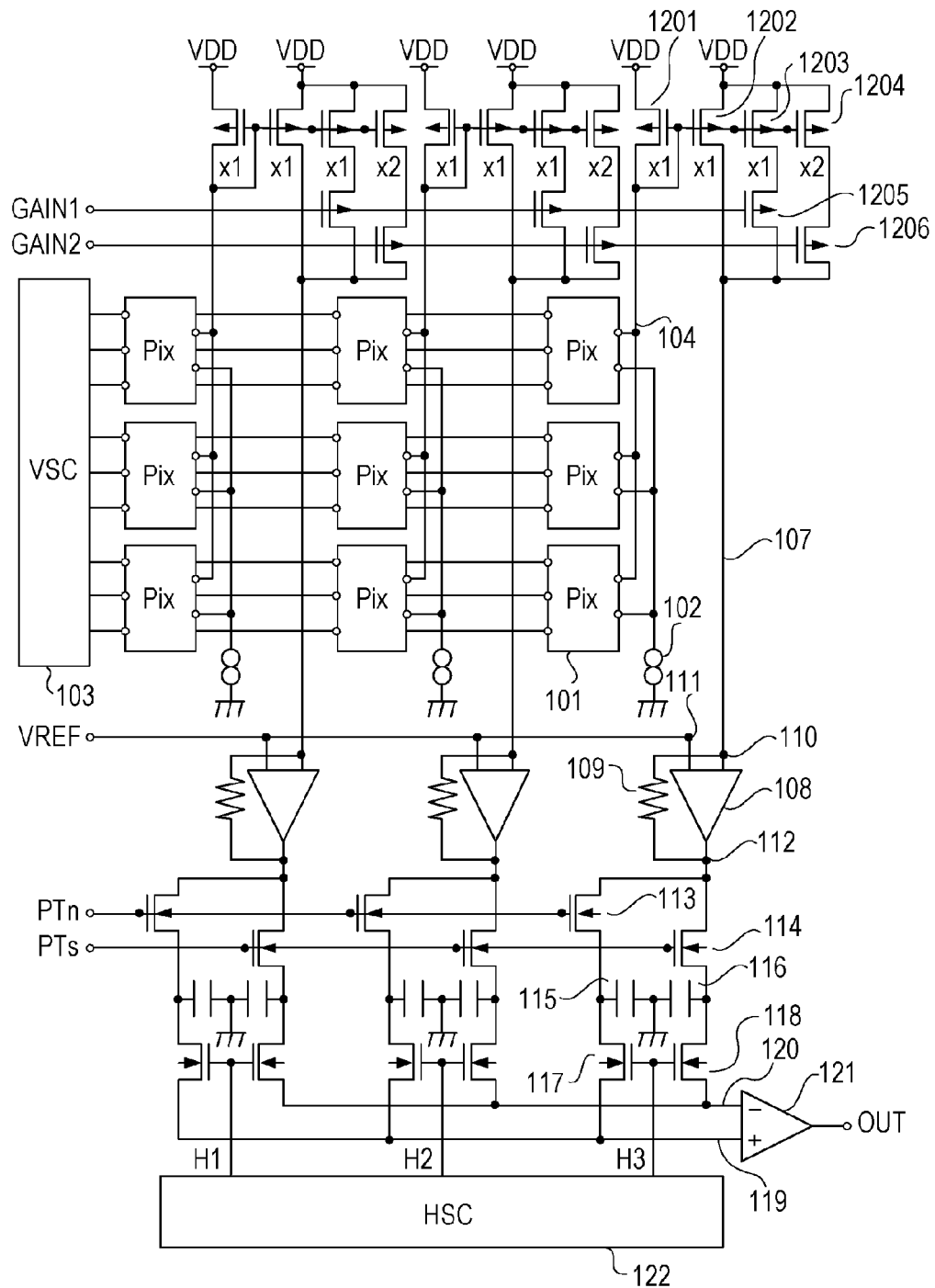
FIG. 12 illustrates an equivalent circuit of a third exemplary embodiment.

FIG. 12 illustrates an equivalent circuit of a photoelectric conversion device according to one or more embodiments. The same reference symbol is used to indicate elements in FIG. 12 and FIG. 1 which perform the same or a similar function, and detailed descriptions of the elements are not repeated.

The photoelectric conversion device of the present embodiment includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion outputs the voltage signal to the outside of the device.

In the present embodiment, the amplification factor of the current mirror circuit is controllable. The other features may be the same as the above described embodiment. The detailed explanation of the same features as the above described embodiment is not repeated.

The current mirror circuit includes an input-side transistor 1201 and three output-side transistors 1202, 1203 and 1204. The input and output-side transistors 1201, 1202, 1203, and 1204 are P-type channel MOS transistors.

The gate and the drain of the input-side transistor 1201 are shorted. The source of the input-side transistor 1201 is electrically connected to a power source line. The power source line may provide the source of the input-side transistor 1201 with a power source voltage VDD. The first output line 104 is electrically connected to the drain of the input-side transistor 1201 and the gate which is shorted to the drain of the input-side transistor 1201.

The output-side transistors 1202, 1203 and 1204 are arranged in parallel. In detail, the sources of the output-side transistors 1202, 1203 and 1204 are respectively connected to the power source line. The power source line may provide the sources of the output-side transistors 1202, 1203 and 1204 with the power source voltage VDD. The gates of the output-side transistors 1202, 1203 and 1204 are respectively connected to the gate of the input-side transistor 1201. The drains of the output-side transistors 1202, 1203 and 1204 are respectively connected to the second output line 107.

The input-side transistor 1201 and the first and second output-side transistors have the substantially same channel widths. The third output-side transistor 1204 has twice as wide a channel width as the input-side transistor 1201. The input and output-side transistors 1201, 1202, 1203 and 1204 have the substantially same channel length.

A first gain control switch 1205 is arranged in an electrical path between the drain of the second output-side transistor 1203 and the second output line 107. The first gain control switch 1205 is a P-type channel MOS transistor. A drive signal GAIN1 may control the first gain control switch 1205 to be turned on or off.

A second gain control switch 1206 is arranged in an electrical path between the drain of the third output-side transistor 1204 and the second output line 107. The second gain control switch 1206 is a P-type channel MOS transistor. A drive signal GAIN2 may control the second gain control switch 1206 to be turned on or off.

The first and second gain control switches 1205 and 1206 may control the amplification factor of the current mirror circuit. The first and second gain control switches 1205 and 1206 may be included in an amplification factor control portion. By using two gain control switches 1205 and 1206, four gain settings may be set.

When both of the first and second gain control switches 1205 and 1206 are turned off, the second and third output-side transistors 1203 and 1204 are disconnected from the second output line 107. Accordingly, only the first output-side transistor 1202 of the three may be connected to the second output line 107. In this case, the mirrored current signal may be output at the amplification factor of about 1.

When the first gain control switch 1205 is turned on and the second gain control switch 1206 is turned off, the third output-side transistors 1204 is disconnected from the second output line 107. Accordingly, the first and second output-side transistors 1202 and 1203 of the three may be connected to the second output line 107. A virtual output-side transistor has twice as wide a channel width as the input-side transistor 1201 may be considered. In this case, the mirrored current signal may be output at the amplification factor of about 2.

When the first gain control switch 1205 is turned off and the second gain control switch 1206 is turned on, the second output-side transistors 1203 is disconnected from the second output line 107. Accordingly, the first and third output-side transistors 1202 and 1204 of the three may be connected to the second output line 107. A virtual output-side transistor which has three times as wide a channel width as the input-side transistor 1201 may be considered. In this case, the mirrored current signal may be output at the amplification factor of about 3.

When both of the first and second gain control switches 1205 and 1206 are turned on, all of the three output-side transistors 1202, 1203 and 1204 may be connected to the second output line 107. A virtual output-side transistor which has four times as wide a channel width as the input-side transistor 1201 may be considered. In this case, the mirrored current signal may be output at the amplification factor of about 4.

As mentioned above, the amplification factor of the current mirror circuit is controllable.

In FIG. 12, three output-side transistors are arranged. However, the number of the output-side transistors is not limited to three. According to the size of each of the transistors, the amplification factor may be determined.

In the case where the current signals from the pixels are individually output, the amplification factor may be changed. For example, the amplification factor may be controlled to be large when the current signal from the pixel has small amplitude, while to be small when the current signal from the pixel has large amplitude.

The amplification factor may be changed between the case where the current signal from a single pixel is output and the case where the current signals form a plurality of the pixels are simultaneously output. For adding or averaging the current signals, a small amplification factor may be used. The small amplification factor may result in a large dynamic range of the subsequent stages.

An exemplary structure of the pixel may be the same as the above described embodiment. The equivalent circuit of the pixel is illustrated in FIG. 2, 3 or 4. The exemplary planar and cross-sectional structures of the pixel are illustrated in FIGS. 5, 6 and 7.

An exemplary operation for the photoelectric conversion device according to the present embodiment may be the same as the above described embodiment. The photoelectric conversion device may be operated according to the drive signals illustrated in FIG. 8 or in FIG. 9.

In the present embodiment, since the amplification factor of the current mirror circuit is controllable, a wide dynamic range and a high signal-to-noise ratio (SN ratio) may be obtained. For capturing a dark object, improvement in SN ratio may be obtained because of a high gain of the current mirror circuit. For capturing a bright object, which is less effected by noises, improvement in dynamic range may be obtained because of a low gain of the current mirror circuit.

Fourth Exemplary Embodiment

Figure 13:
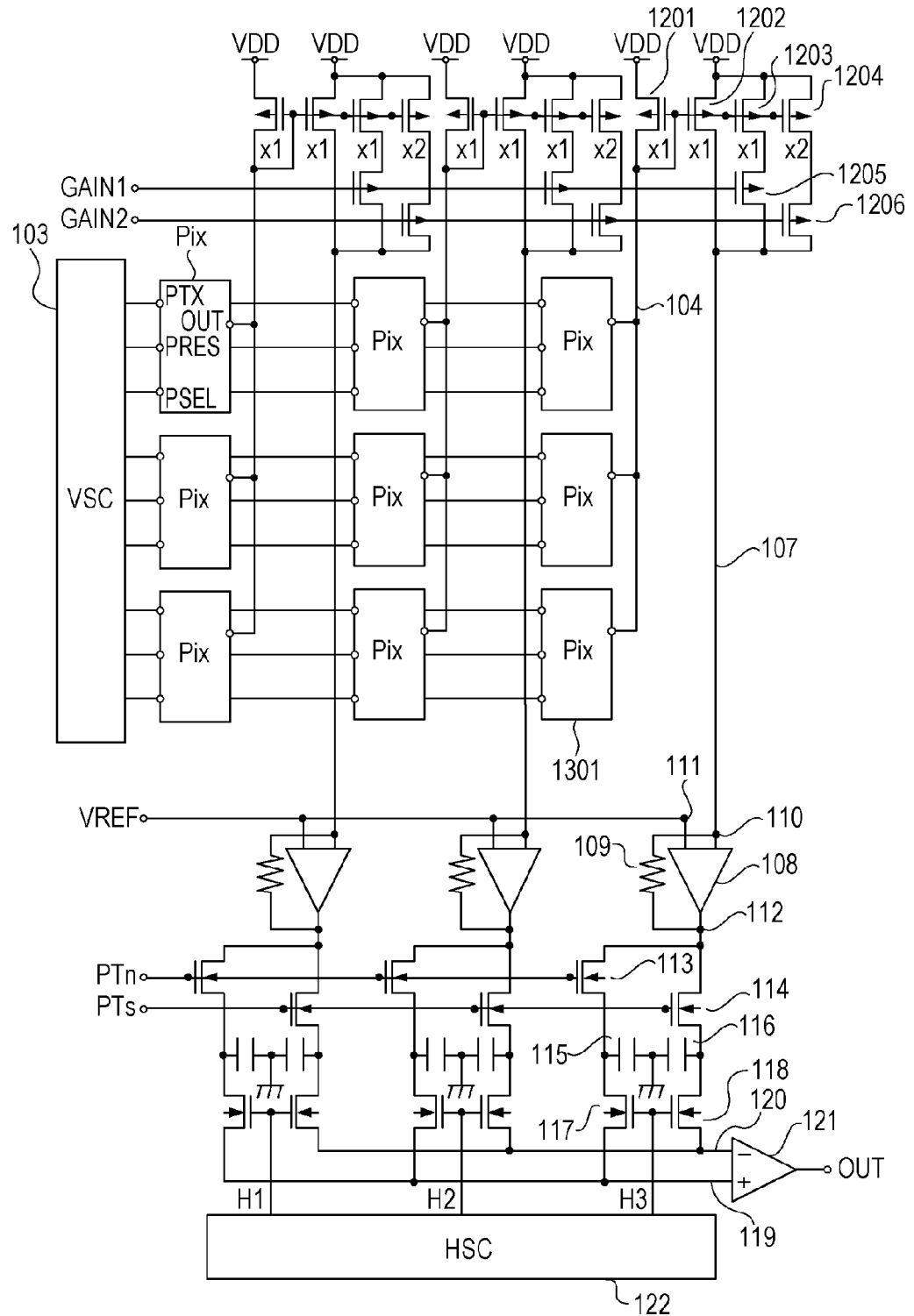
FIG. 13 illustrates an equivalent circuit of a fourth exemplary embodiment.

FIG. 13 illustrates an equivalent circuit of a photoelectric conversion device according to one or more embodiments. The same reference symbol is used to indicate elements in FIG. 13 and either one of FIG. 1 or 12 which perform the same or a similar function, and detailed descriptions of the elements are not repeated.

The photoelectric conversion device of the present embodiment includes a plurality of pixels, a current mirror circuit, a current to voltage convertor, a voltage signal storing portion, an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the current to voltage convertor via the current mirror circuit. The current to voltage convertor converts the current signal, which is output from the pixel, into a voltage signal. The voltage signal storing portion stores the voltage signal, which is converted from the current signal. According to drive signals the horizontal scanning circuit provides, the voltage signal stored by the storing portion is read out to the output portion. The output portion outputs the voltage signal to the outside of the device.

In the present embodiment, a structure of the pixel is different from those of the above described embodiments. The other features may be the same as the above described embodiments. The detailed explanation of the same features as the above described embodiments is not repeated.

The pixel 1301 includes the OUT node, via which the current signal from the pixel 1301 is output. The pixel 1301 may further includes a plurality of nodes (PTX node, PRES node and PSEL node), via which drive signals are provided. The pixel 1301 does not include a BIAS node. Therefore, a bias current source 102 which is provided for each of the pixel columns is omitted. The other nodes have the same configuration as the above described embodiments.

The pixel 1301 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 14:
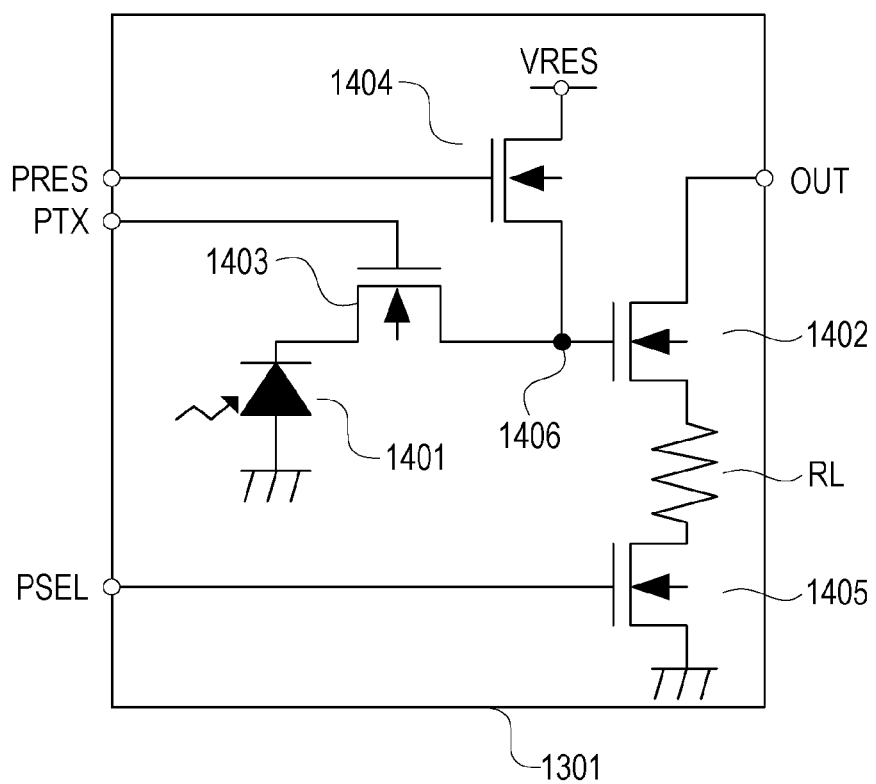
FIG. 14 illustrates an equivalent circuit of an exemplary pixel of an exemplary embodiment.

FIG. 14 illustrates an equivalent circuit of the pixel 101 according to one or more embodiments. The photoelectric conversion unit may be, for example, a photodiode (below, PD) 1401. The pixel amplification unit may be, for example, a common source amplifier. The common source amplifier includes an amplification transistor 1402 and a load resistor RL. The pixel 1301 may include a transfer transistor 1403, a reset transistor 1404, and a selection transistor 1405.

The anode of the PD 1401 is provided with a ground voltage GND. The cathode of the PD 1401 is electrically connected to a node 1406 via the transfer transistor 1403. The transfer transistor 1403 transfers the charges generated at the PD 1401 to the node 1406.

The gate of the amplification transistor 1402 is electrically connected to the node 1406. The gate of the amplification transistor 1402 is an input node of the common source amplifier. The voltage at the gate of the amplification transistor 1402 may be a voltage corresponding to the amount of charges which are transferred to the node 1406. In another aspect, the transferred charges are converted into a voltage signal at the node 1406. The drain of the amplification transistor 1402 is electrically connected to the OUT node. The source of the first input transistor 1402 is electrically connected to the drain of the selection transistor 1405 via the load resistor RL.

The node 1406 is electrically connected to the reset voltage line via the reset transistor 1404. When the reset transistor 1404 is turned on, the node 1406 is provided with the reset voltage VRES. In other words, the reset transistor 1404 may reset the voltage of the first input node of the common source amplifier.

The drain of the selection transistor 1405 is electrically connected to the load resistor RL. The source of the selection transistor 1405 may be provided with the ground voltage GND.

The gate of the transfer transistor 1403 is electrically connected to the PTX node. The gate of the reset transistor 1404 is electrically connected to the PRES node. The gate of the selection transistor 1405 is electrically connected to the PSEL node. The vertical scanning circuit 103 provides each gate of the transistors with a drive signal for controlling each of the transistors to be turned on or off.

The current signal corresponding to the amount of charges which are transferred to the input node of the common source amplifier may be output via the OUT node into the first output line 104. The selection transistor 1405 may select a pixel 1301 which outputs the current signal, out of the plurality of the pixels 1301. In detail, when the selection transistor 1405 is turned on, the common source amplifier may output the current signal via the OUT node.

In FIG. 14, the electron is used as the signal charge, and is transferred to the node 1406, which is the gate of the amplification transistor 1402. The transfer of the electron may lower the voltage of the node 1406. The more the charges are transferred, the lower the voltage of the node 1406 may become. Since, in the bright situation, a large amount of charges may be transferred to the node 1406, the voltage of the node 1406 may be low. Since the amplification transistor 1402 has an N-type channel, the amplitude of the current signal may be smaller in the bright situation than in the dark situation. The dark situation may include a situation where the voltage of the node 1406 has been reset and charges are not transferred to the node 1406.

The load resistor RL may include a MOS transistor with a diode-type connection, where the gate and the drain are shorted. In the case where the MOS transistor with a diode-type connection is used, the fill factor of the pixel may be improved by reduction of the size of the element. Therefore, sensitivity and/or a saturation amount of charges may be improved.

The transfer transistor 1403 and the selection transistor 1405 may be provided in one or more embodiment. In other embodiments, one or both of the transfer transistor 1403 and the selection transistor 1405 may be omitted. In case one or both of the transfer transistor 1403 and the selection transistor 1405 is/are omitted, the fill factor of the pixel may be improved by reduction of the number of the pixel transistors.

An exemplary operation for the photoelectric conversion device according to the present embodiment may be the same as the above described embodiments. The photoelectric conversion device may be operated according to the drive signals illustrated in FIG. 8 or FIG. 9.

In the present embodiment, the pixel includes the common source amplifier. The common source amplifier may include a smaller number of elements than a differential amplifier. Hence, the fill factor of the pixel may be improved by reduction of the number of the pixel transistors. Therefore, sensitivity and/or a saturation amount of charges may be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-274892 filed Dec. 15, 2011, which is hereby incorporated by reference herein in its entirety.

What is claimed is:

1. An electronic device comprising:
a plurality of first output lines for current signals from a plurality of signal sources being output to the first output lines; and
a plurality of current to voltage convertors, each of the current to voltage convertors being electrically connected to a corresponding one of the first output lines,
wherein the current to voltage convertor includes a first amplification unit,
wherein an offset reduction unit in a subsequent stage of the current to voltage convertor is provided for each of the first output lines,
wherein the first amplification unit includes an operational amplifier having a first input node and a second input node,
wherein a resistor is provided in an electrical path between the first input node and an output node of the operational amplifier of the first amplification unit,
wherein the first input node is configured to be provided with the current signal from the signal source,
wherein the second input node is configured to be provided with a reference voltage, and
wherein the current to voltage convertor is configured to convert the current signal into a voltage between both nodes of the resistor.

2. The electronic device according to claim 1, further comprising the plurality of the signal sources,
wherein at least two of the plurality of the signal sources are electrically connected to each of the first output lines, and
wherein each of the plurality of the signal sources includes a photoelectric conversion unit and a transistor configured to output a current signal based on an amount of charges generated by the photoelectric conversion unit to the corresponding first output line.

3. The electronic device according to claim 2,
wherein the plurality of the signal sources are configured to simultaneously output the current signals from two or more of the signal sources to the first output line, and
wherein the first output line is configured such that the current signals simultaneously output to the first output line are summed up at the first output line.

4. The electronic device according to claim 3, further comprising a bias current source configured to provide each of the plurality of the signal sources with a bias current,
wherein the bias current source is configured to provide a first bias current for one of the plurality of the signal sources individually outputting the current signal, and to provide a second bias current, having a larger amplitude than that of the first bias current, for two or more of the plurality of the signal sources simultaneously outputting the current signals.

5. The electronic device according to claim 2, further comprising a first semiconductor substrate,
wherein the photoelectric conversion unit is provided in the first semiconductor substrate,
wherein the first output lines are provided on a first surface of the first semiconductor substrate, and
wherein the photoelectric conversion unit is configured to convert incident light from a second surface of the first semiconductor substrate, opposite to the first surface, into a charge.

6. The electronic device according to claim 5, further comprising a second semiconductor substrate facing to the first surface of the first semiconductor substrate,
wherein the first output lines are provided between the first and second semiconductor substrates, and
wherein either one of or both of the transistor and the current to voltage convertor is/are provided in the second semiconductor substrate.

7. The electronic device according to claim 1, wherein the resistor is configured to have variable resistance.

8. An electronic device comprising:
a plurality of first output lines for current signals from a plurality of signal sources being output to the first output lines; and
a plurality of current to voltage convertors, each of the current to voltage convertors being electrically connected to a corresponding one of the first output lines,
wherein the current to voltage convertor includes an first amplification unit,
wherein a first storing unit and a second storing unit electrically connected to an output node of the current to voltage converter are provided for each of the first output lines,
wherein the first storing unit includes a first capacitor electrically connected to the output node of the current to voltage converter via a first switch, and
wherein the second storing unit includes a second capacitor electrically connected to the output node of the current to voltage converter via a second switch.

9. The electronic device according to claim 8, further comprising:
a second output line and a third output line, wherein voltage signals stored in the first and second storing unit are to be output correspondingly to the second and third output lines by capacitive division of charges; and
a differential processing unit configured to output a differential signal based on the difference between the voltage signals at the second and third output lines.

10. The electronic device according to claim 8, further comprising the plurality of the signal sources,
wherein at least two of the plurality of the signal sources are electrically connected to each of the first output lines, and
wherein each of the plurality of the signal sources includes a photoelectric conversion unit and a transistor configured to output a current signal based on an amount of charges generated by the photoelectric conversion unit to the corresponding first output line.

11. The electronic device according to claim 10,
wherein the plurality of the signal sources are configured to simultaneously output the current signals from two or more of the signal sources to the first output line, and
wherein the first output line is configured such that the current signals simultaneously output to the first output line are summed up at the first output line.

12. The electronic device according to claim 11, further comprising a bias current source configured to provide each of the plurality of the signal sources with a bias current,
wherein the bias current source is configured to provide a first bias current for one of the plurality of the signal sources individually outputting the current signal, and to provide a second bias current, having a larger amplitude than that of the first bias current, for two or more of the plurality of the signal sources simultaneously outputting the current signals.

13. The electronic device according to claim 8,
wherein the first amplification unit includes an operational amplifier having a first input node and a second input node,
wherein a resistor is provided in an electrical path between the first input node and an output node of the operational amplifier of the first amplification unit,
wherein the first input node is configured to be provided with the current signal from the signal source,
wherein the second input node is configured to be provided with a reference voltage,
wherein the current to voltage convertor is configured to convert the current signal into a voltage between both nodes of the resistor.

14. The electronic device according to claim 13, wherein the resistor is configured to have variable resistance.

15. An electronic device comprising:
a plurality of first output lines for current signals from a plurality of signal sources being output to the first output lines; and
a plurality of current to voltage convertors, each of the current to voltage convertors being electrically connected to a corresponding one of the first output lines,
wherein the current to voltage convertor includes a first amplification unit,
wherein a third capacitor, a fourth capacitor, a second amplification unit and a switch are provided for each of the first output lines,
wherein the second amplification unit includes an operational amplifier having at least two input nodes,
wherein one node of the third capacitor is electrically connected to an output node of the current to voltage convertor, and another node of the third capacitor is electrically connected to one of the input nodes of the operational amplifier of the second amplification unit,
wherein one node of the fourth capacitor is electrically connected to the one of the input nodes of the operational amplifier of the second amplification unit, and another node of the fourth capacitor is electrically connected to an output node of the operational amplifier of the second amplification unit, and
wherein the switch is provided in an electrical path between the one of the input nodes of the operational amplifier of the second amplification unit and the output node of the operational amplifier of the second amplification unit in parallel to the fourth capacitor wherein a resistor is provided in an electrical path between the first input node and an output node of the operational amplifier of the first amplification unit, wherein the first input node is configured to be provided with the current signal from the signal source, wherein the second input node is configured to be provided with a reference voltage, wherein the current to voltage convertor is configured to convert the current signal into a voltage between both nodes of the resistor.

16. The electronic device according to claim 15, further comprising the plurality of the signal sources,
wherein at least two of the plurality of the signal sources are electrically connected to each of the first output lines, and
wherein each of the plurality of the signal sources includes a photoelectric conversion unit and a transistor configured to output a current signal based on an amount of charges generated by the photoelectric conversion unit to the corresponding first output line.

17. The electronic device according to claim 15, wherein the resistor is configured to have variable resistance.

18. An electronic device comprising:
a plurality of the signal sources,
a plurality of first output lines for current signals from the plurality of signal sources being output to the first output lines; and
a plurality of current to voltage convertors, each of the current to voltage convertors being electrically connected to a corresponding one of the first output lines, wherein the current to voltage convertor includes a first amplification unit, wherein an offset reduction unit in a subsequent stage of the current to voltage convertor is provided for each of the first output lines, wherein at least two of the plurality of the signal sources are electrically connected to each of the first output lines, wherein each of the plurality of the signal sources includes a photoelectric conversion unit and a transistor configured to output a current signal based on an amount of charges generated by the photoelectric conversion unit to the corresponding first output line, wherein the plurality of the signal sources are configured to simultaneously output the current signals from two or more of the signal sources to the first output line, and wherein the first output line is configured such that the current signals simultaneously output to the first output line are summed up at the first output line, wherein the electronic device further comprises a bias current source configured to provide each of the plurality of the signal sources with a bias current, and wherein the bias current source is configured to provide a first bias current for one of the plurality of the signal sources individually outputting the current signal, and to provide a second bias current, having a larger amplitude than that of the first bias current, for two or more of the plurality of the signal sources simultaneously outputting the current signals.

19. An electronic device comprising:
a first semiconductor substrate,
a second semiconductor substrate facing to the first surface of the first semiconductor substrate,
a plurality of the signal sources,
a plurality of first output lines for current signals from the plurality of signal sources being output to the first output lines; and
a plurality of current to voltage convertors, each of the current to voltage convertors being electrically connected to a corresponding one of the first output lines, wherein the current to voltage convertor includes a first amplification unit, wherein an offset reduction unit in a subsequent stage of the current to voltage convertor is provided for each of the first output lines, wherein at least two of the plurality of the signal sources are electrically connected to each of the first output lines, wherein each of the plurality of the signal sources includes a photoelectric conversion unit and a transistor configured to output a current signal based on an amount of charges generated by the photoelectric conversion unit to the corresponding first output line, wherein the photoelectric conversion unit is provided in the first semiconductor substrate, wherein the first output lines are provided on a first surface of the first semiconductor substrate, and wherein the photoelectric conversion unit is configured to convert incident light from a second surface of the first semiconductor substrate, opposite to the first surface, into a charge, wherein the first output lines are provided between the first and second semiconductor substrates, and wherein either one of or both of the transistor and the current to voltage convertor is/are provided in the second semiconductor substrate.

* * * * *